US011662953B2

(12) United States Patent
Sato et al.

(10) Patent No.: US 11,662,953 B2
(45) Date of Patent: May 30, 2023

(54) DATA COMPRESSION/DECOMPRESSION SYSTEM, AND DATA COMPRESSION/DECOMPRESSION METHOD

(71) Applicant: Hitachi, Ltd., Tokyo (JP)

(72) Inventors: Katsuto Sato, Tokyo (JP); Hiroaki Akutsu, Tokyo (JP); Akifumi Suzuki, Tokyo (JP); Takahiro Naruko, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/481,130

(22) Filed: Sep. 21, 2021

(65) Prior Publication Data

US 2022/0129208 A1 Apr. 28, 2022

(30) Foreign Application Priority Data

Oct. 26, 2020 (JP) .............................. JP2020-178649

(51) Int. Cl.
*G06F 3/06* (2006.01)
*H03M 7/30* (2006.01)

(52) U.S. Cl.
CPC ............ *G06F 3/0661* (2013.01); *G06F 3/067* (2013.01); *G06F 3/0608* (2013.01); *H03M 7/30* (2013.01)

(58) Field of Classification Search
CPC ...... G06F 3/0608; G06F 3/0661; G06F 3/067; G06K 7/1495; G05B 2219/33135; G05B 2219/34101; H03M 7/30; H04N 19/42

USPC ................. 345/202, FOR. 130; 348/14.13; 370/202; 379/88.1; 380/217; 381/106; 382/166; 455/72; 704/2, 7, 201, 202, (Continued)

(56) References Cited

U.S. PATENT DOCUMENTS

2002/0101367 A1\* 8/2002 Geiger .................... H03M 7/30
341/51
2004/0045030 A1 3/2004 Reynolds
(Continued)

FOREIGN PATENT DOCUMENTS

CN 108881916 A \* 11/2018
JP 4852228 B 1/2012

*Primary Examiner* — Ilwoo Park
(74) *Attorney, Agent, or Firm* — Procopio, Cory, Hargreaves & Savitch LLP

(57) ABSTRACT

To provide a data compression/decompression system that can appropriately decompress compressed data.

A first computer generates first identification information that can identify a first execution environment; and stores the first identification information on a storage device in association with compressed data of data. A second computer generates second identification information that can identify a second execution environment; and determines whether or not the first identification information, and the second identification information match. In a case that it is determined that the first identification information, and the second identification information do not match, the second computer requests a third computer that is capable of decompression of the compressed data to decompress the compressed data, the third computer decompresses the compressed data, and transmits decompressed data to the second computer, and the second computer completes the decompression of the compressed data by receiving the decompressed data from the third computer.

8 Claims, 20 Drawing Sheets

(58) Field of Classification Search
USPC ............... 704/203, 259, 500, 503; 707/693; 708/203; 710/68; 715/242
See application file for complete search history.

(56) References Cited

U.S. PATENT DOCUMENTS

| | | | | |
|---|---|---|---|---|
| 2009/0052452 A1* | 2/2009 | Patel | ..................... | H04L 45/04 370/392 |
| 2014/0314155 A1* | 10/2014 | Neff | ................... | H04L 65/1101 375/240.26 |
| 2019/0304138 A1 | 10/2019 | Fuller et al. | | |

* cited by examiner

FIG.13
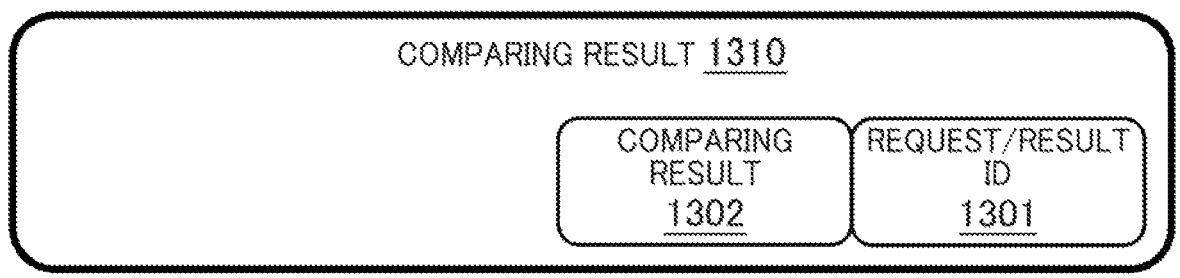
OR
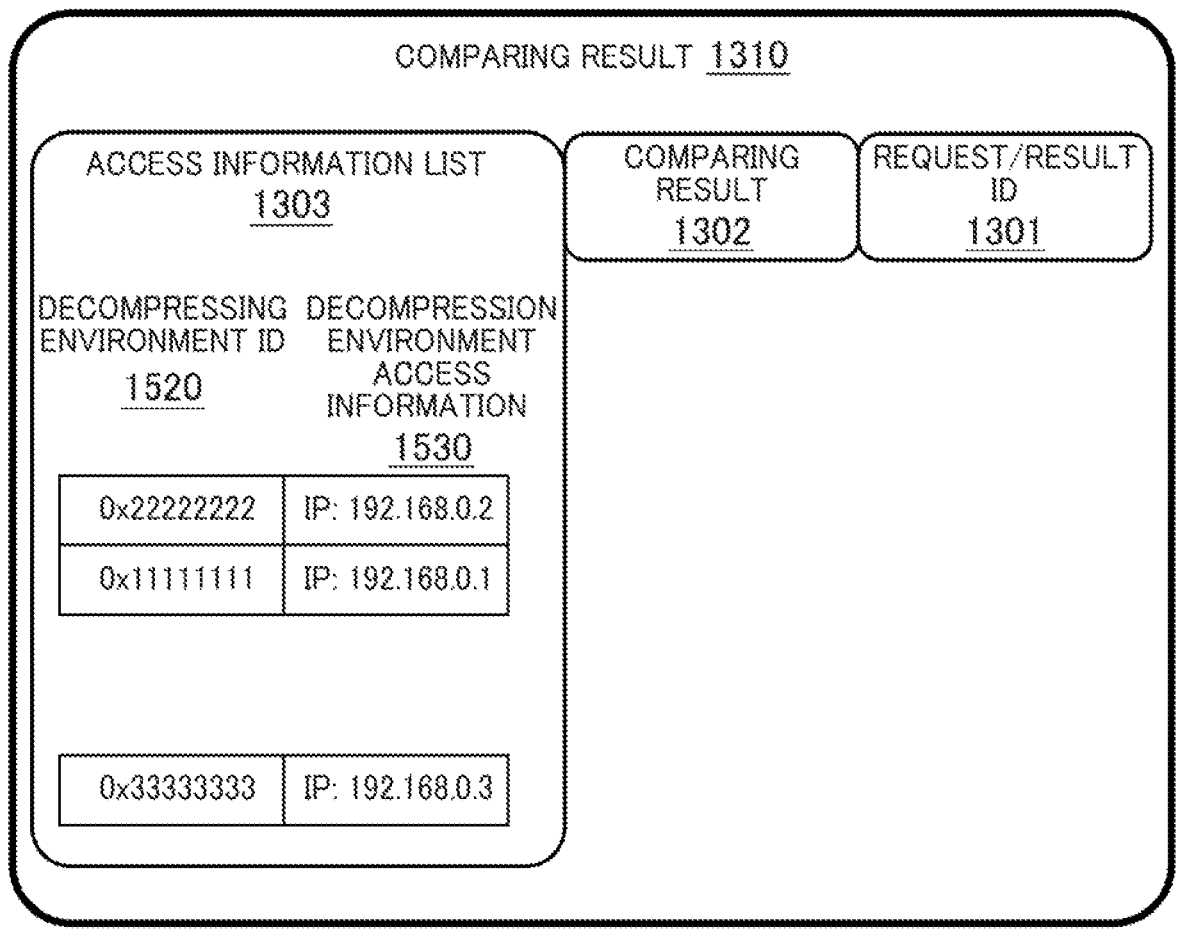

FIG.14
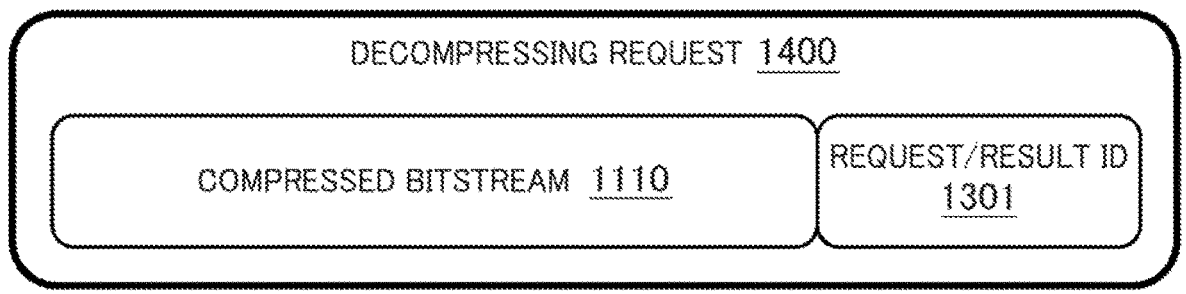
OR
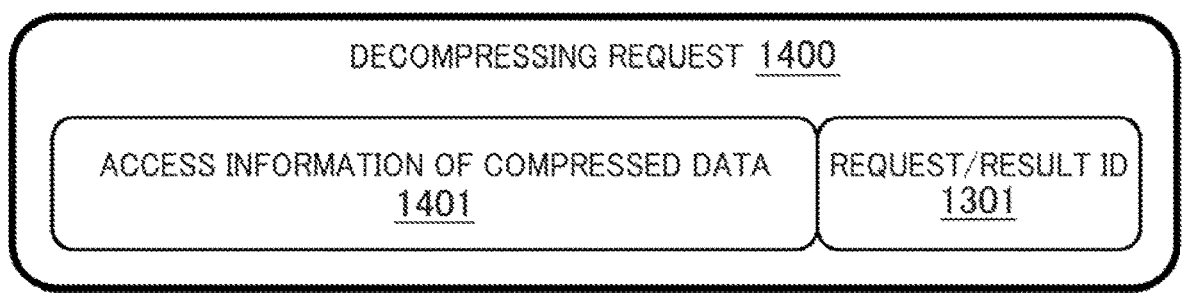

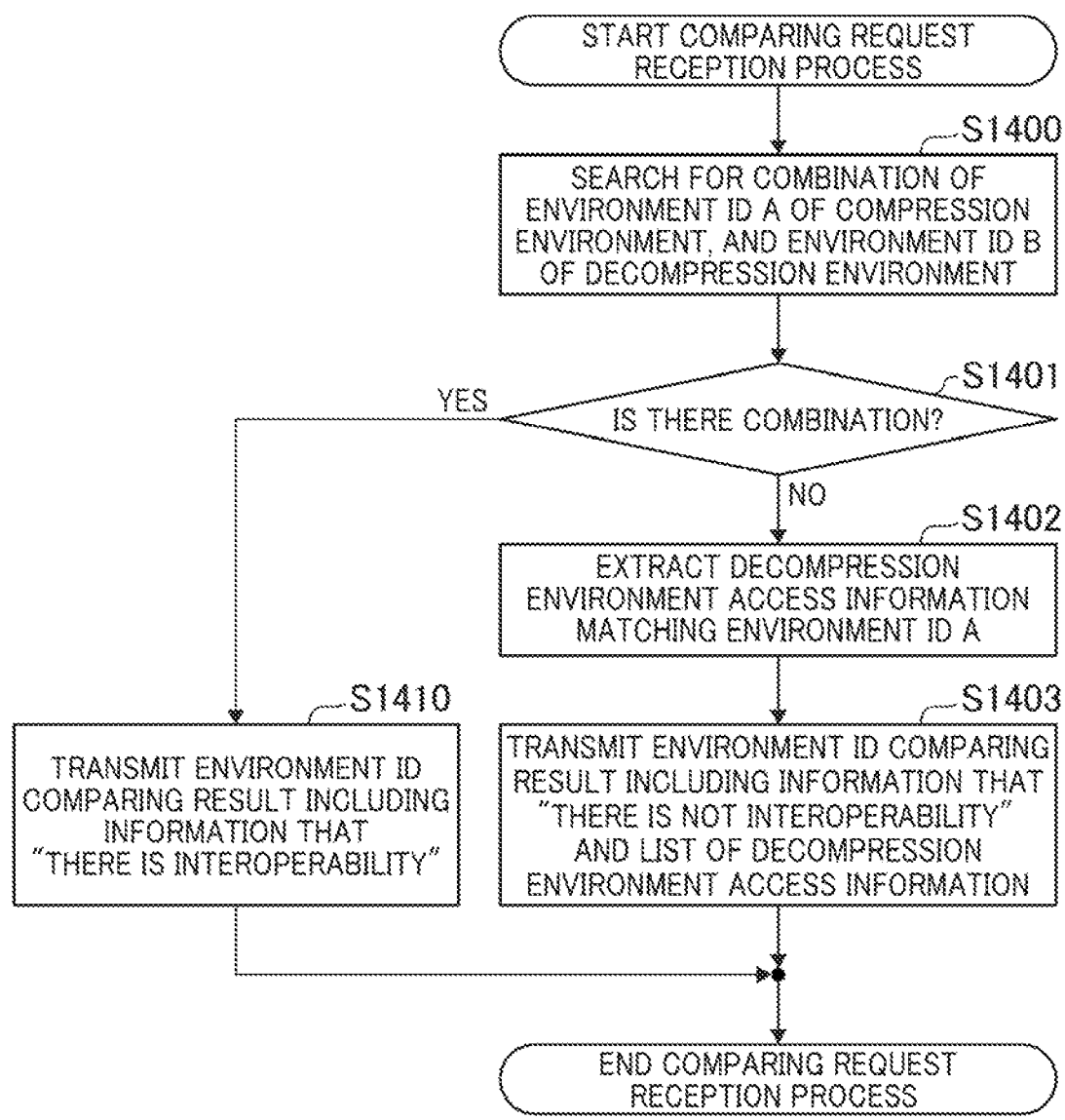

DATA COMPRESSION/DECOMPRESSION SYSTEM, AND DATA COMPRESSION/DECOMPRESSION METHOD

BACKGROUND

The present invention generally relates to control of a system that performs data compression, and data decompression by using machine learning models.

In order to store, at low costs, data that is generated mechanically and in a large amount from IoT (Internet of Things) equipment or the like, it is necessary to achieve a high compression rate only to such an extent that the meaning of data is not impaired. In order to achieve this, it can be considered to perform data compression, and data decompression by using a neural network (hereinafter, NN).

In processes using neural networks, it is necessary to perform a large amount of operations, and so various types of specialized hardware have been proposed and used in order to make it possible to use them at practical speeds. In these types of specialized hardware, in order to optimize amounts of hardware resource to be used while significantly enhancing computation speeds, means for performing operations while retaining internal data in non-standard formats, and so on have been adopted. In the coming future also, it is predicted that specialized hardware optimized for various uses will appear.

When systems that perform compression processes, and decompression processes by using such specialized hardware are considered, it is predicted that situations in which different types of specialized hardware are used at the time of compression, and at the time of decompression will occur. In lossy compression processes also, partially, there are processes in which it is required to obtain completely the same results at the time of decompression with results at the time of compression. In a case that different hardware configurations are used for such processes, there will be a problem that a situation occurs in which operation processes themselves are not supported or computation results do not match.

In a technology described in U.S. Unexamined Patent Application Publication No. 2019/0304138, texture data which has been compressed in a format that cannot be decoded by hardware of an image processing apparatus (Graphics Processing Unit, GPU) is subjected to a decompression process at a central processing unit (Central Processing Unit, CPU) on the basis of metadata, and is transferred to the GPU, to thereby make it possible to read in textures which cannot be processed by the GPU as is.

In a technology described in Japanese Patent No. 4852228, an optimum algorithm is selected on a compression side at the time of transfer of time-series images, and a receiving side receives and decompresses compressed data, and information about the type of the selected algorithm, to thereby attempt to optimize a transfer amount, and also to make it possible to complete a decompression process.

SUMMARY

In a case that a compression process is performed by using hardware specialized for a neural network, a decompression process fails if identical results cannot be obtained also on a decompression process side. Particularly, in a case that non-standard formats are used for internal representations, or a compression process is performed by specialized hardware that uses special operation instructions, even if mathematically identical compression/decompression algorithms are used, it becomes difficult to obtain identical computation results at the time of compression, and at the time of decompression, and it becomes impossible to perform decompression.

In the technology described in U.S. Unexamined Patent Application Publication No. 2019/0304138, for algorithms which are not supported by hardware at the time of decompression, a general-purpose processor executes a decompression process as a proxy to thereby complete the decompression process, but in a case that the compression side uses specialized hardware, even the general-purpose processor cannot correctly execute the decompression process, and cannot complete the decompression process.

In the technology described in Japanese Patent No. 4852228, programs are switched on the basis of decompression process algorithm information to thereby make it possible to decompress data that has been compressed by a plurality of different algorithms, but it is not possible to avoid problems attributable to internal representations or the like of hardware.

According to what is mentioned above, even if any of the technologies disclosed in U.S. Unexamined Patent Application Publication No. 2019/0304138, and Japanese Patent No. 4852228 is used, a failure of a decompression process attributable to non-interoperability of execution environments cannot be avoided.

The present invention has been made taking the points above into consideration, and is to propose a data compression/decompression system, and the like that can appropriately decompress compressed data.

In order to solve the problems, the present invention provides a data compression/decompression system that controls compression, and/or decompression of data performed by using a machine learning model at each of a plurality of computers, in which a first computer that performs compression of data in a first execution environment: generates first identification information that can identify the first execution environment; and stores the first identification information on a storage device in association with compressed data of the data, second computer that performs decompression of the compressed data in a second execution environment: generates second identification information that can identify the second execution environment; and determines whether or not the first identification information, and the second identification information match, and in a case that it is determined that the first identification information, and the second identification information do not match, the second computer requests a third computer that is capable of decompression of the compressed data to decompress the compressed data, the third computer decompresses the compressed data, and transmits decompressed data to the second computer, and the second computer completes the decompression of the compressed data by receiving the decompressed data from the third computer.

According to the configuration described above, for example, in a case that the compressed data is decompressed in the second execution environment which is different from an execution environment at the time of compression, it becomes possible for the second computer to determine whether or not the decompression will be completed normally. In addition, for example, according to the configuration described above, in a case that the decompression will not be able to be completed normally, the second computer can complete the decompression by requesting the third execution environment which serves as a proxy to perform the decompression.

According to the present invention, it becomes possible to appropriately decompress compressed data.

BRIEF DESCRIPTION OF THE DRAWINGS

FIG. 13 is a figure depicting an example of the configuration of an environment ID comparing result according to the first embodiment.

FIG. 14 is a figure depicting an example of the configuration of a decompressing request according to the first embodiment.

FIG. 22 is a figure depicting an example of a comparing request reception process according to the first embodiment.

DETAILED DESCRIPTION

(1) First Embodiment

Figure 1:
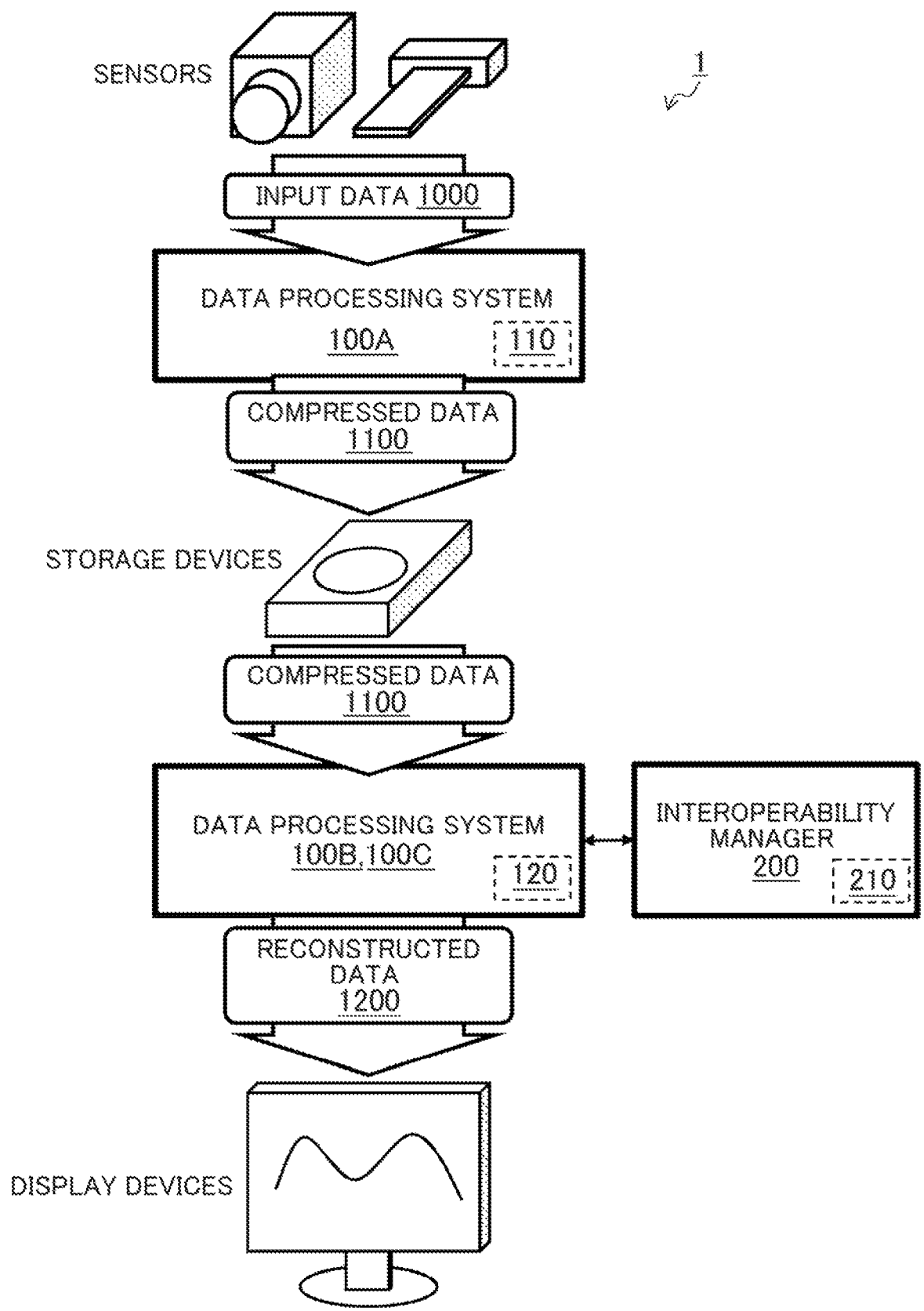
FIG. 1 is a figure depicting the overall overview of a data compression/decompression system according to a first embodiment.

Hereinafter, one embodiment of the present invention is mentioned in detail. However, the present invention is not limited to the embodiment.

At the time of each of compression, and decompression, a data compression/decompression system according to the present embodiment generates an ID that can identify an execution environment, on the basis of information about hardware or the like of the execution environment. At the time of compression, the present data compression/decompression system stores, in combination with compressed data, a first ID corresponding to a first execution environment.

At the time of decompression, the present data compression/decompression system compares a second ID generated at a second execution environment at the time of decompression, and corresponding to the second execution environment, and the first ID having been stored along with the compressed data. In a case that the first ID, and the second ID match, the present data compression/decompression system implements a decompression process, and completes the decompression process. In a case that the first ID, and the second ID do not match, the present data compression/decompression system refers to a local interoperability table, and checks whether there is interoperability between the first execution environment at the time of compression, and the second execution environment at the time of decompression.

In the present data compression/decompression system, in a case that the interoperability between the first execution environment, and the second execution environment cannot be checked in the local interoperability table, an inquiry including the first ID, and the second ID is made to an interoperability manager, and it is checked whether or not there is interoperability. In a case that there is interoperability, the present data compression/decompression system implements a decompression process in the second execution environment. In a case that there is not interoperability, the present data compression/decompression system acquires information necessary for performing proxy decompression in an interoperable third execution environment from the local interoperability table or the interoperability manager, and implements the proxy decompression in the third execution environment. The present data compression/decompression system completes the decompression process after obtaining a result of the decompression implemented in the third execution environment.

In the following explanation, an "interface apparatus" may mean one or more interface devices. The one or more interface devices may be at least one of the following.

One or more I/O (Input/Output) interface devices. Each I/O (Input/Output) interface device is an interface device that interfaces at least one of an I/O device, and a remote display computer. The I/O interface device that interfaces the display computer may be a communication interface device. At least one I/O device may be any of user interface devices, for example, input devices like a keyboard, and a pointing device, and output devices like a display device.

One or more communication interface devices. The one or more communication interface devices may be one or more communication interface devices of the same type (e.g. one or more NICs (Network Interface Cards)), or may be two or more communication interface devices of different types (e.g. an NIC, and an HBA (Host Bus Adapter)).

In addition, in the following explanation, a "processor" means one or more processor devices. At least one processor device typically is a microprocessor device like a central processing unit (CPU), but may be a different type of processor device like a graphics processing unit (GPU). In addition, it may be a neural network processing unit (NPU, Neural network Processing Unit) having a functionality specialized for neural network processes. At least one processor device may be a single core processing device or may be a multicore processing device. At least one processor device may be a processor core. At least one processor device may be a processor device in a broad sense that adopts a hardware circuit (e.g. an FPGA (Field Programmable Gate Array) or an ASIC (Application Specific Integrated Circuit)) that performs some or all of processes as a form of implementation.

In addition, expressions like compressor, decompressor, and comparator are used to explain functionalities in some cases in the following explanation. These functionalities may be realized by a processor executing a machine learning model (e.g. a neural network), a computer program or the like, or may be realized by a hardware circuit (e.g. an FPGA or an ASIC). In a case that the functionalities are realized by the processor executing the program, determined processes are performed while storage devices, interface apparatuses, and/or the like are used as appropriate, and so the functionalities may be regarded as being at least part of the processor. The processes explained as being performed by the functionalities may be regarded as being processes performed by the processor or an apparatus having the processor. The program may be installed from a program source. For example, the program source may be a program distributing computer or a computer-readable recording medium (e.g. a non-transitory recording medium). An explanation of each functionality is an example, and a plurality of functionalities may be integrated into one functionality, one functionality may be divided into a plurality of functionalities, and so on.

In addition, at least some of compressors, decompressors, and comparators may be realized by hardware circuits.

Next, an embodiment of the present invention is explained on the basis of the figures. The following description, and figures are illustration for explaining the present invention, and for the purpose of clarification of the explanation, explanations are omitted and simplified as appropriate. The present invention can be implemented also in other various forms. Unless limited particularly, there are no problems even if the number of each constituent element is one or large than one.

Note that in the following explanation, identical elements in the figures are given the same numbers, and explanations are omitted as appropriate. In addition, in a case that elements of the same types are explained without making distinctions therebetween, common portions (portions excluding branch numbers) in their reference characters including the branch numbers are used, and in a case that elements of the same types are explained by making distinctions therebetween, the reference characters including the branch numbers are used, in some cases. For example, in a case that data processing systems are explained without making particular distinctions therebetween, they are described as "data processing systems 100," and in a case that individual data processing systems are explained by making distinctions therebetween, they are described like a "data processing system 100A," and a "data processing system 100B," in some cases.

FIG. 1 depicts the overall overview of a data compression/decompression system 1. The data compression/decompression system 1 includes one or more data processing systems 100, and an interoperability manager 200. A data processing system 100A includes a data compressor 110, and the like. Each of a data processing system 100B, and a data processing system 100C includes a data decompressor 120, and the like. The interoperability manager 200 includes a central environment ID comparator 210, and the like.

The data processing system 100A acquires input data 1000 from sensors such as one-dimensional sensor or two-dimensional sensor. The data processing system 100A generates compressed data 1100 from the input data 1000, and stores the compressed data 1100 on a storage device such as an HDD (Hard Disk Drive) or an SSD (Solid State Drive). When referring to the compressed data 1100 stored on the storage device, the data processing system 100B reads out the compressed data 1100 from the storage device, and checks the interoperability between an execution environment (hereinafter, a compression environment) at the time of compression, and an execution environment (hereinafter, a decompression environment) at the time of decompression as necessary in cooperation with the interoperability manager 200. The interoperable data processing system 100B or the data processing system 100C that is requested to perform a decompression process as a proxy performs a decompression process on the compressed data 1100, and generates reconstructed data 1200. The generated reconstructed data 1200 is output to a display apparatus or the like, and used thereon.

Examples of the type of the input data 1000 include one-dimensional data, two-dimensional data, time-series data, and the like. The one-dimensional data is temperature data, pressure data or the like. The two-dimensional data is data formed by combining one-dimensional data, and one-dimensional data, an image or the like. The time-series data is data in which one-dimensional data, and time are associated with each other (e.g. time-related temperature data, time-related temperature data), data in which two-dimensional data, and time are associated with each other (e.g. moving images), or the like. Note that the input data 1000 may be input from one or more sensors (and/or one or more devices of different types). The compressed data 1100 may be output to one or more storage devices (and/or one or more devices of different types).

Figure 2:
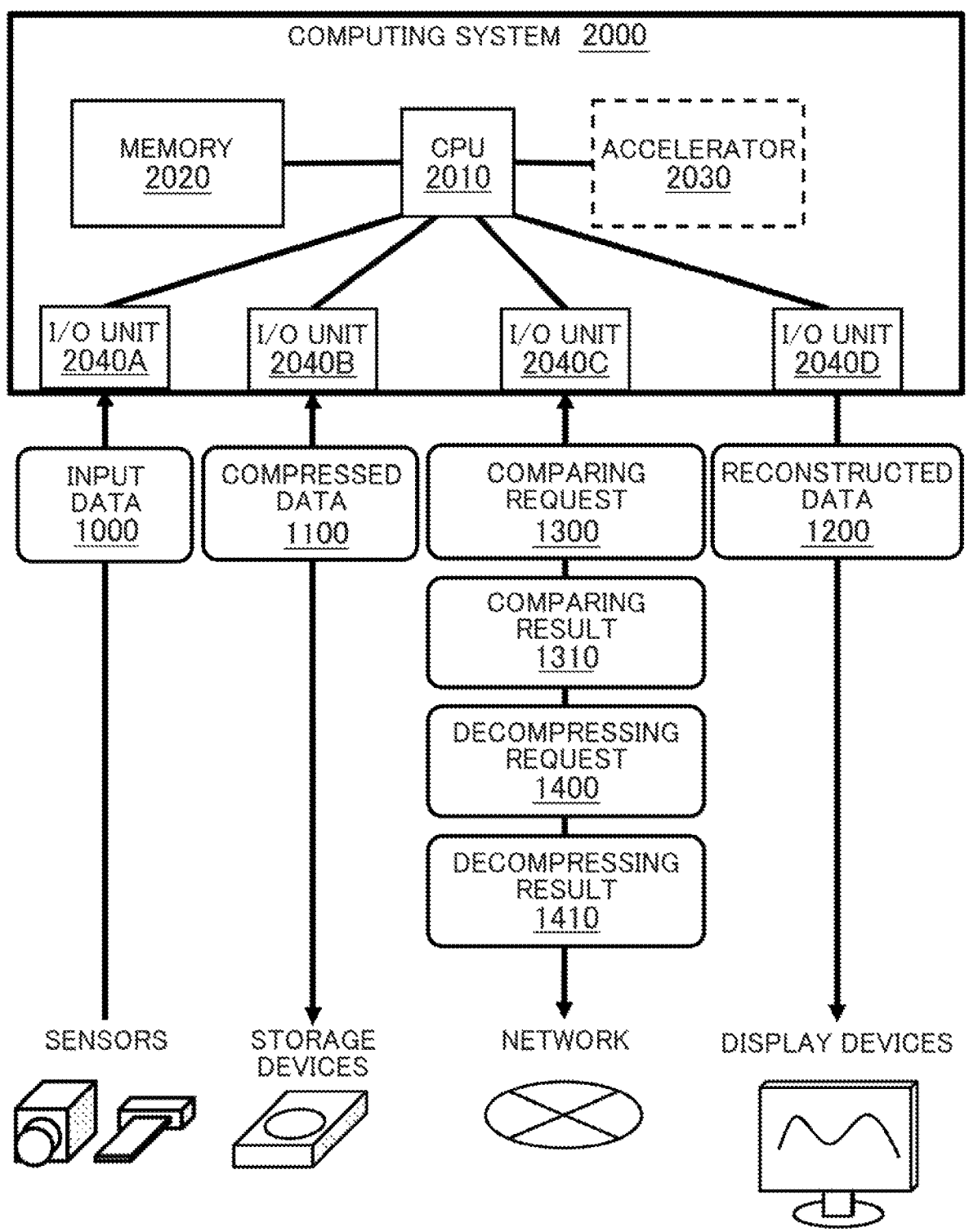
FIG. 2 is a figure depicting an example of the configuration of a data processing system according to the first embodiment.

FIG. 2 depicts an example (computing system 2000) of a representative physical configuration of the data processing system 100.

The computing system 2000 includes a central processing unit (CPU) 2010, a memory (Memory) 2020, and, as necessary, an accelerator (Accelerator) 2030, and I/O units (I/O Units) 2040. Note that the accelerator 2030 is a specialized arithmetic operation apparatus like a neural network that accelerates operations specialized in particular processes, an acceleration arithmetic operation apparatus that accelerates operations no matter what processes the operations are for, or the like.

A functionality realized by the data processing system 100 is realized by executing a program having been read into the memory 2020 at the central processing unit 2010 or the accelerator 2030 or by using a functionality that implements some of processes as hardware as a part of the central processing unit 2010 or the accelerator 2030.

An I/O unit 2040A receives the input data 1000 from sensors or the like. An I/O unit 2040B reads in the compressed data 1100 from a storage device or the like, and writes the compressed data 1100 in a storage device or the like. An I/O unit 2040C performs communication of an environment ID comparing request 1300, an environment ID comparing result 1310, a decompressing request 1400, and a decompressing result 1410 with another data processing system 100. An I/O unit 2040D outputs the reconstructed data 1200 to a display apparatus or the like.

Figure 3:
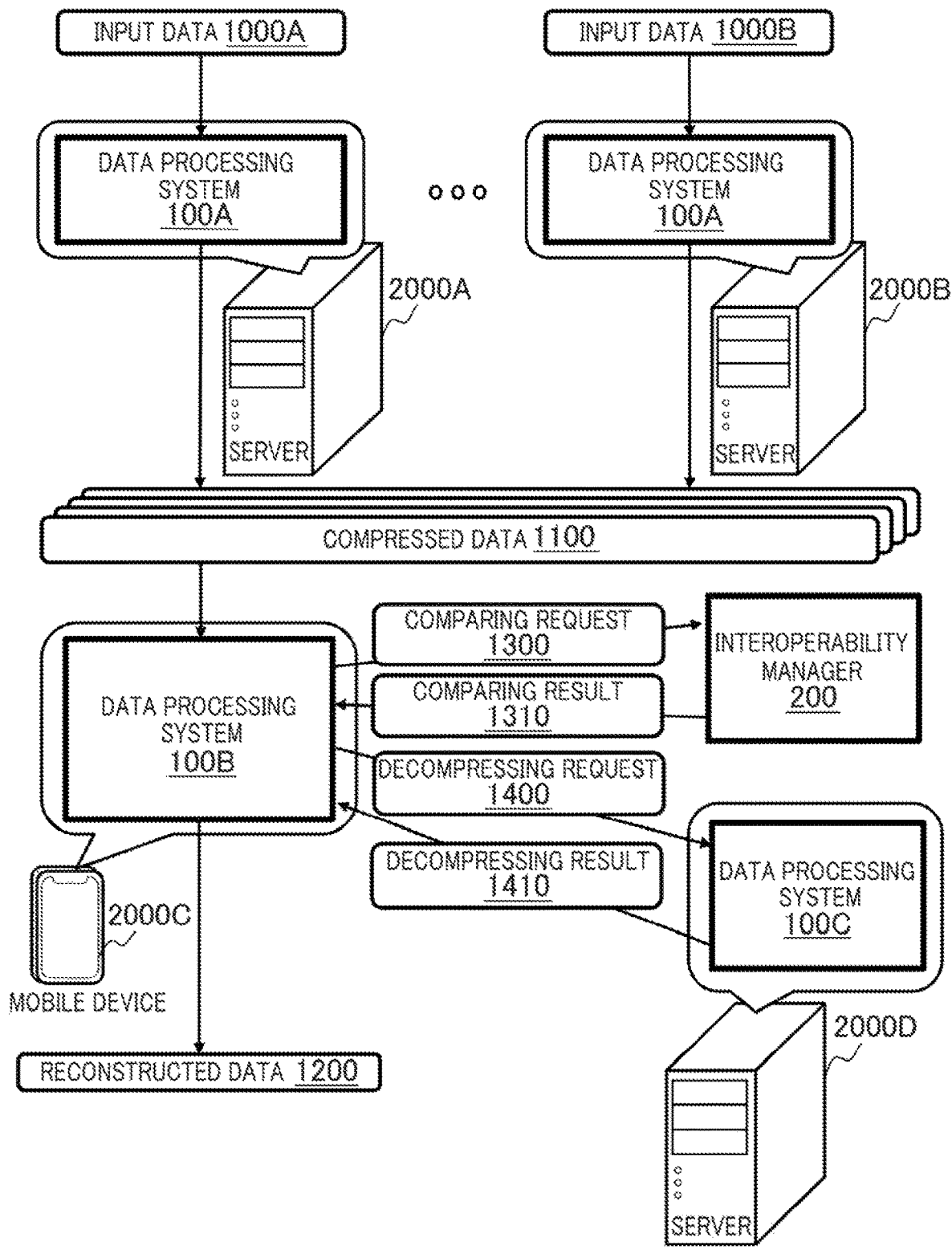
FIG. 3 is a figure depicting a data flow at the time of operation of the data compression/decompression system according to the first embodiment, and the relationship between data processing systems, and computing systems.

FIG. 3 depicts a data flow at the time of operation of the data compression/decompression system 1, and the relationship between data processing systems 100, and computing systems 2000.

Various types of the input data 1000 are processed on the computing systems 2000 arranged at locations of the input data 1000, the input data 1000 is processed by the data processing system 100A that performs a data compression process, and the compressed data 1100 is generated. At this time, two or more types of computing systems 2000 may be mixedly present as the computing systems 2000.

FIG. 3 depicts an example in which, at the time of a decompression process, a computing system 2000C which is different from the computing system 2000A, and the computing system 2000B that have been used for compression processes reads out the compressed data 1100.

The data processing system 100B that performs a decompression process reads out the compressed data 1100, compares a first environment ID 1120A stored in the compressed data 1100, and a second environment ID 1120B corresponding to the computing system 2000C, and determines whether or not there is interoperability. In a case that the environment IDs do not match, for example, the data processing system 100B makes an inquiry to the interoperability manager 200 by using the ID comparing request 1300, receives the comparing result 1310 from the interoperability manager 200, and determines whether or not there is interoperability. In a case that there is interoperability, the data processing system 100B implements a decompression process, and outputs the reconstructed data 1200.

In a case that it is determined that the computing system 2000C is not interoperable, the data processing system 100B transmits, to the data processing system 100C that operates on a computing system 2000D, and performs a decompression process, the decompressing request 1400 on the basis of access information included in the comparing result 1310. The access information is information for accessing the interoperable computing system 2000D. The data processing system 100C performs a decompression process as a proxy, and transmits the decompressing result 1410 including the reconstructed data 1200 to the data processing system 100B. The data processing system 100B takes out the reconstructed data 1200 from the decompressing result, and outputs the reconstructed data 1200 to thereby complete the decompression process.

In a case that the computing system 2000C is not interoperable, and also an interoperable computing system 2000 could not be found, the data processing system 100B reports an error indicating that decompression is not possible.

As a possible specific example of the above, for example, the input data 1000 is time-series images of a monitoring camera or the like, and data (compressed data 1100) compressed by using specialized hardware for speeding up a unique neural network process mounted on on-site IoT equipment (e.g. the computing system 2000A) is referred to by a mobile terminal (e.g. the computing system 2000C). The mobile terminal also has specialized hardware mounted thereon in some cases, but it is not always the case that it is interoperable with specialized hardware used for compression. If a decompression process is performed by using hardware which is not interoperable, there is a possibility that the reconstructed data 1200 gets corrupted. Therefore, in a case that there is not interoperability, an interoperable server device (the computing system 2000D) performs a decompression process.

Note that the computing system 2000 depicted in the present embodiment may be a computer such as a stand-alone server device, incorporated information processing equipment, a cloud virtual server or a mobile terminal.

Figure 4:
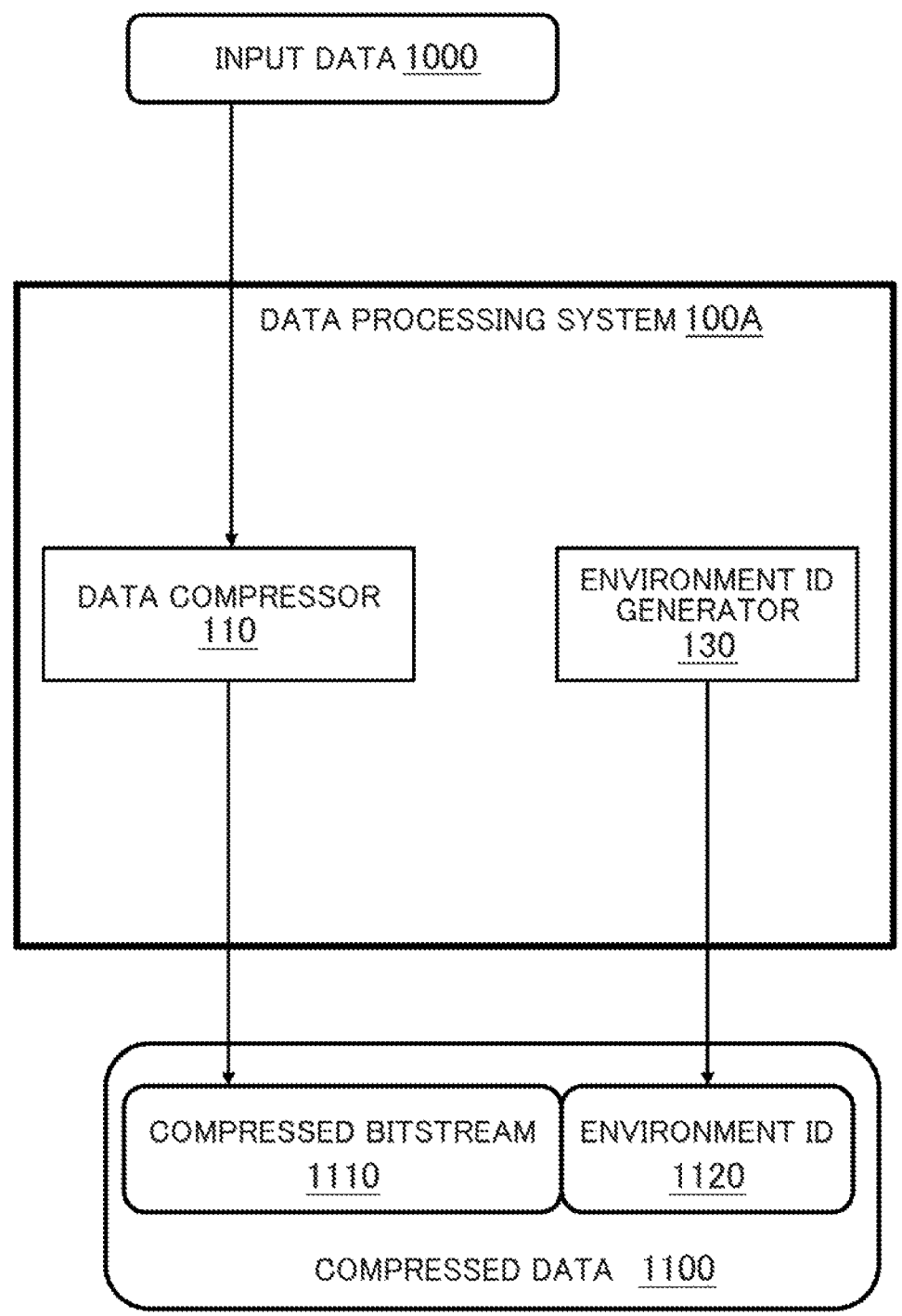
FIG. 4 is a figure depicting an example of a data processing system according to the first embodiment.

FIG. 4 depicts an example of the data processing system 100A that perform a compression process. The data processing system 100A includes the data compressor 110, and an environment ID generator 130.

The data compressor 110 reads in the input data 1000, and generates a compressed bitstream 1110. Simultaneously, the environment ID generator 130 outputs an environment ID 1120. The data processing system 100A combines the compressed bitstream 1110, and the environment ID 1120 together to generate the compressed data 1100, and outputs the compressed data 1100.

Figure 5:
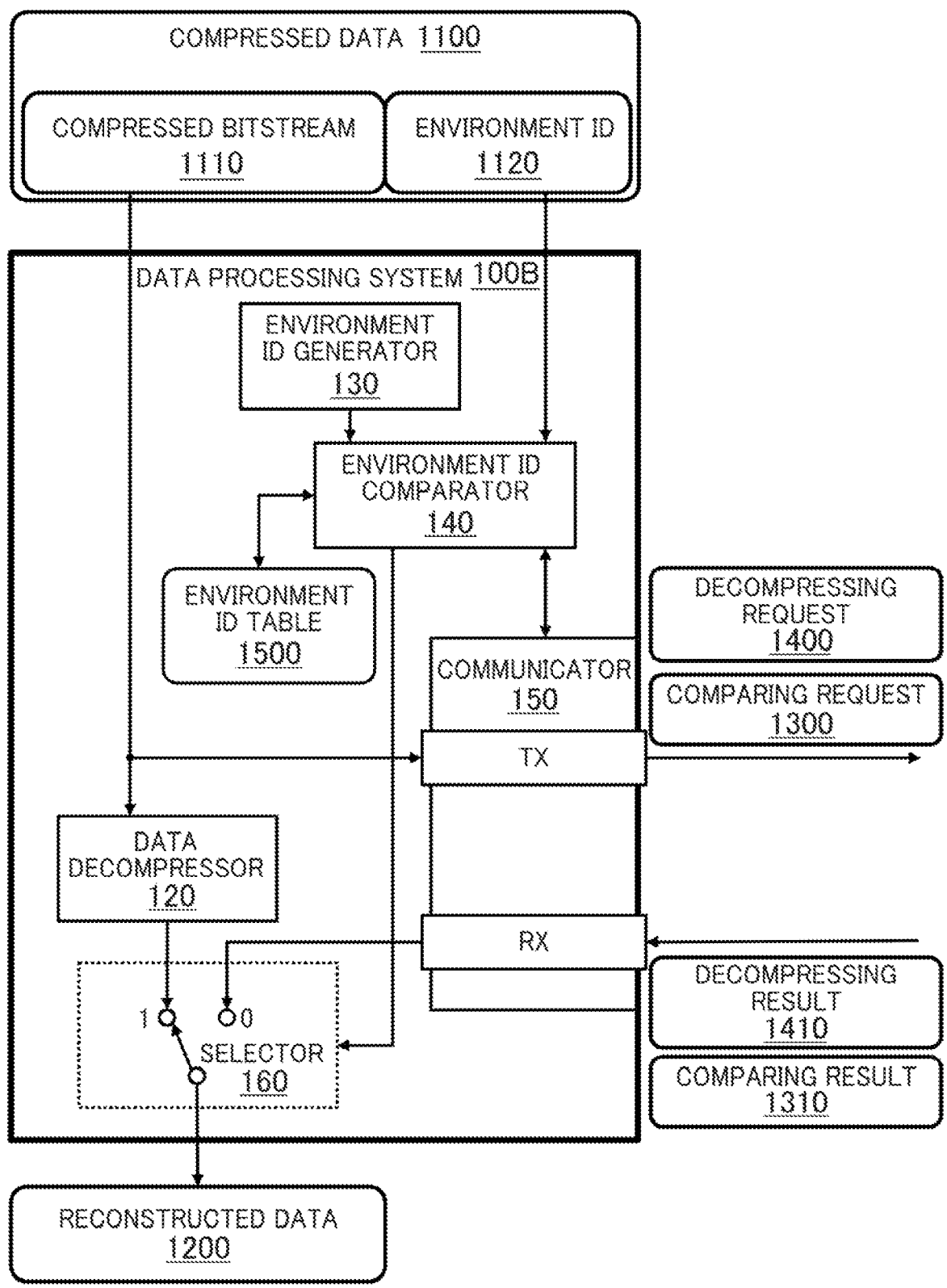
FIG. 5 is a figure depicting an example of a data processing system according to the first embodiment.

FIG. 5 depicts an example of the data processing system 100B that performs a decompression process. The data processing system 100B includes the data decompressor 120, the environment ID generator 130, an environment ID comparator 140, a communicator 150, and a selector 160.

The data decompressor 120 reads in the compressed bitstream 1110 included in the compressed data 1100, and outputs the reconstructed data 1200.

The environment ID comparator 140 reads in the first environment ID 1120A included in the compressed data 1100, and compares it with the second environment ID 1120B generated by the environment ID generator 130. In a case that the both the environment IDs 1120 match completely, the environment ID comparator 140 determines that decompression is possible, outputs, to the selector 160, a signal, for example "1," for outputting output of the data decompressor 120 to the outside, and sets the selector 160.

In a case that both the environment IDs 1120 do not match completely, the environment ID comparator 140 uses an environment ID table 1500, performs transmission of the comparing request 1300, and reception of the comparing result 1310 with the interoperability manager 200 via the communicator 150, and so on, to thereby check interoperability, and determine whether to implement a proxy decompression process.

In a case that a proxy decompression process is implemented, the communicator 150 performs transmission of the decompressing request 1400, and reception of the decompressing result 1410, outputs, to the selector 160, a signal, for example "0," for outputting a proxy decompressing result to the outside, and sets the selector 160.

Figure 6:
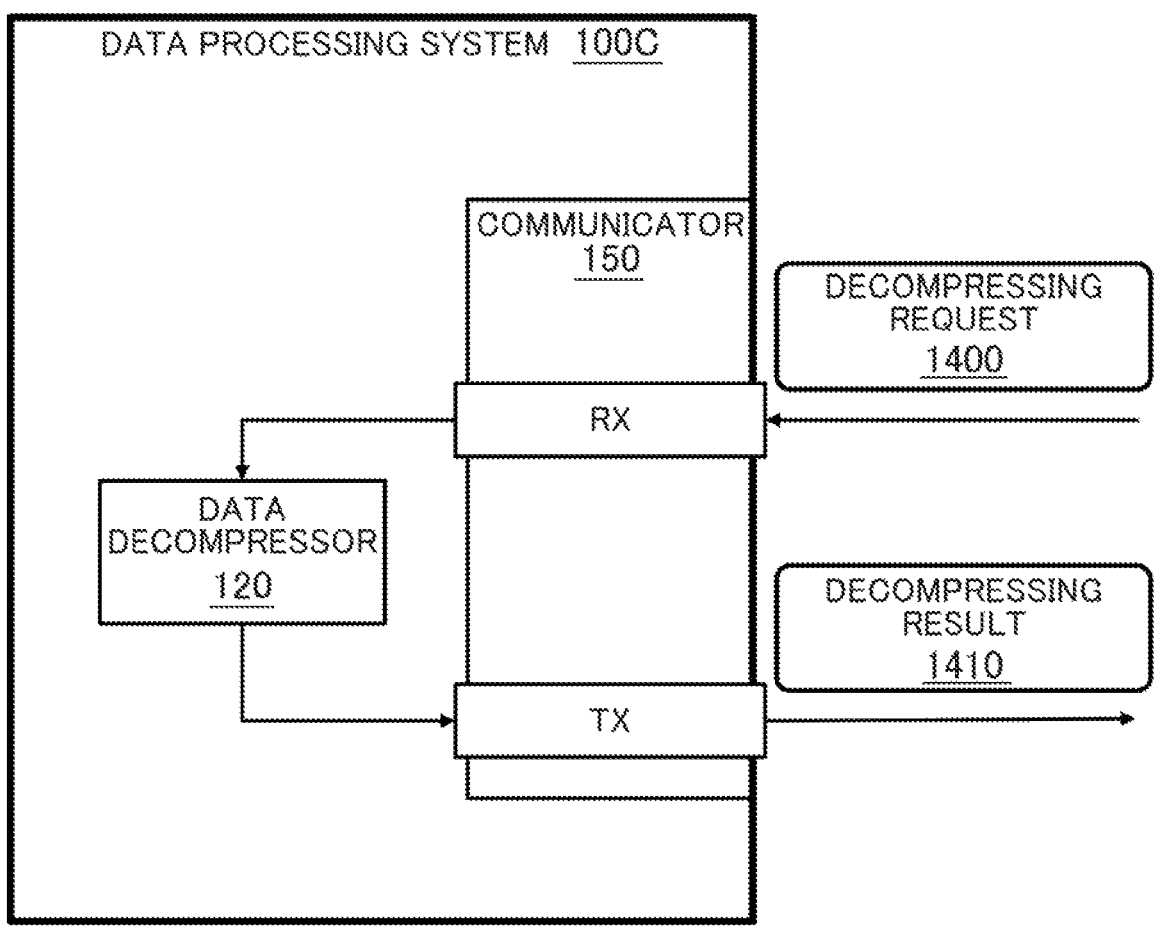
FIG. 6 is a figure depicting an example of a data processing system according to the first embodiment.

FIG. 6 depicts an example of the data processing system 100C that performs a decompression process as a proxy. The data processing system 100C includes the data decompressor 120, and the communicator 150.

Upon receiving the decompressing request 1400, the communicator 150 acquires the compressed data 1100 included in the decompressing request 1400, or the compressed data 1100 on the basis of positional information of the compressed data 1100 (compressed data access information 1401 mentioned below), and transfers the compressed data 1100 to the data decompressor 120. The data decompressor 120 performs a decompression process, and transfers the reconstructed data 1200 to the communicator 150. The communicator 150 transmits the decompressing result 1410 including the reconstructed data 1200 to the sender of the decompressing request 1400.

Figure 7:
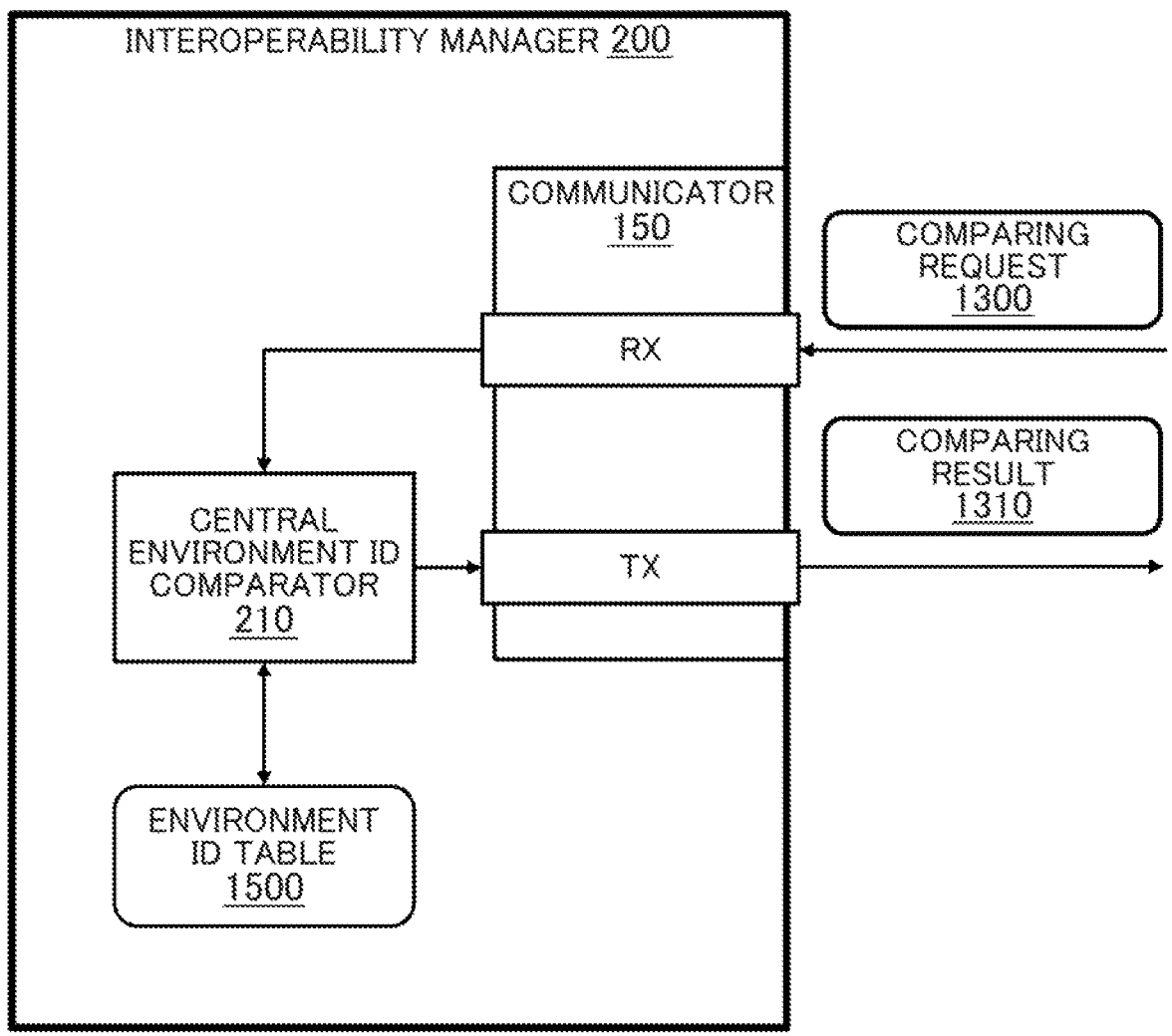
FIG. 7 is a figure depicting an example of an interoperability manager according to the first embodiment.

FIG. 7 depicts an example of the interoperability manager 200. The interoperability manager 200 includes the communicator 150, and the central environment ID comparator 210.

Upon receiving the environment ID comparing request 1300, the communicator 150 takes out the first environment ID 1120A, and the second environment ID 1120B included in the environment ID comparing request 1300, and transfers them to the central environment ID comparator 210.

The central environment ID comparator 210 refers to the environment ID table 1500, and performs a search to find out whether there is a combination of the first environment ID 1120A, and the second environment ID 1120B. In a case that there is the combination, the central environment ID comparator 210 transmits, to the sender of the comparing request 1300 via the communicator 150, the comparing result 1310 including the comparing result 1302 indicating that "there is interoperability."

In a case that there is not the combination, the central environment ID comparator 210 transmits, to the sender of the environment ID comparing request 1300 via the communicator 150, the comparing result 1310 including an access information list 1303 mentioned below along with the comparing result 1302 indicating that "there is not interoperability." Note that the access information list 1303 is information about a combination of a decompressing environment ID 1520, and decompression environment access information 1530 that the first environment ID 1120A generated at the time of compression, and a compressing environment ID 1510 match.

Figure 8:
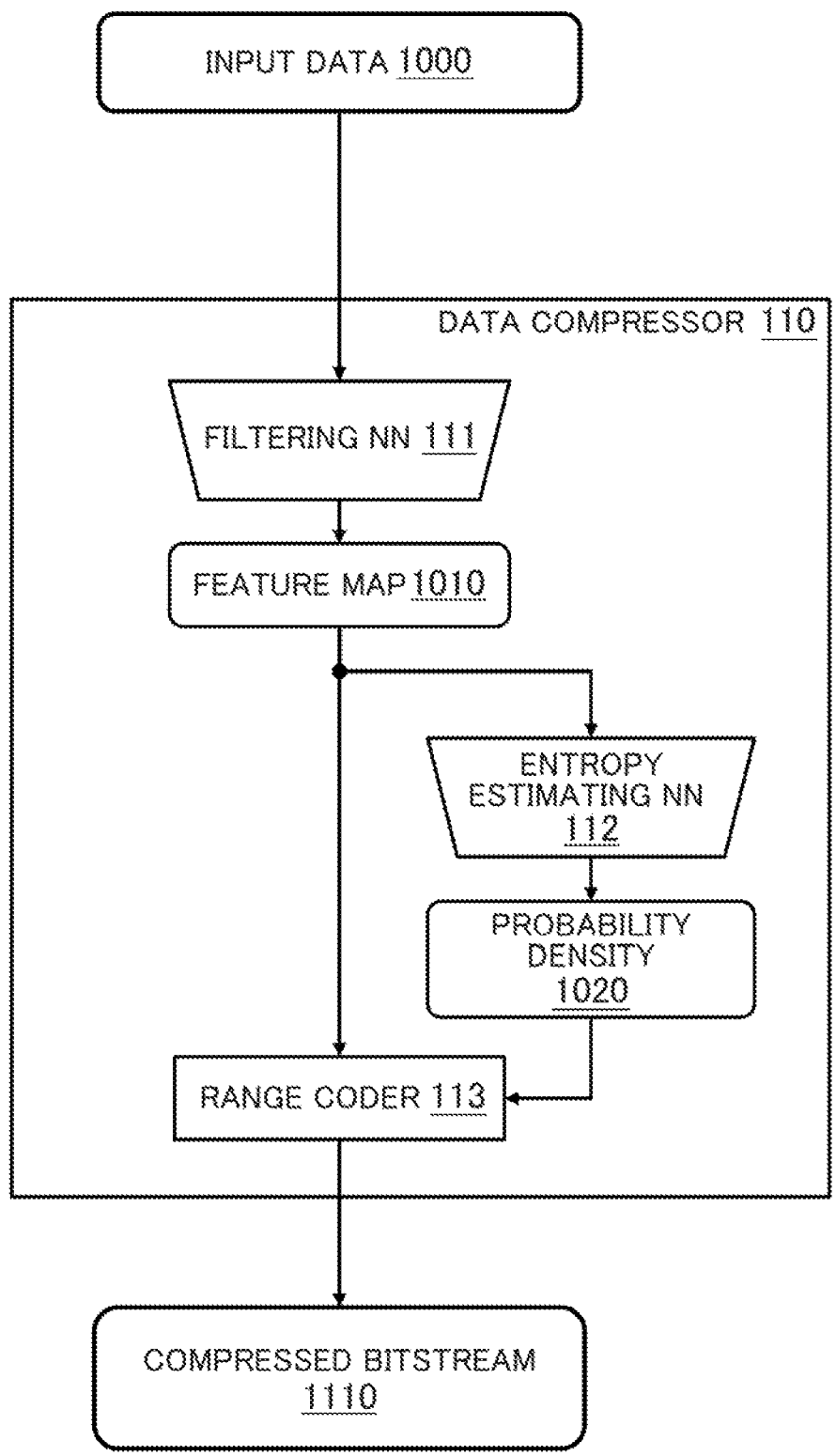
FIG. 8 is a figure depicting an example of a data compressor according to the first embodiment.

FIG. 8 depicts an example of the internal configuration of the data compressor 110. The data compressor 110 includes a filtering neural network 111, an entropy estimating neural network 112, and a range coder 113.

First, the filtering neural network 111 processes the input data 1000, and converts it into a feature map 1010 representing extracted features of an original image. Using the feature map 1010 as input, the entropy estimating neural network 112 processes the feature map 1010, and generates a probability density 1020. The range coder 113 reads in the feature map 1010, and the probability density 1020, and generates and outputs the compressed bitstream 1110.

Figure 9:
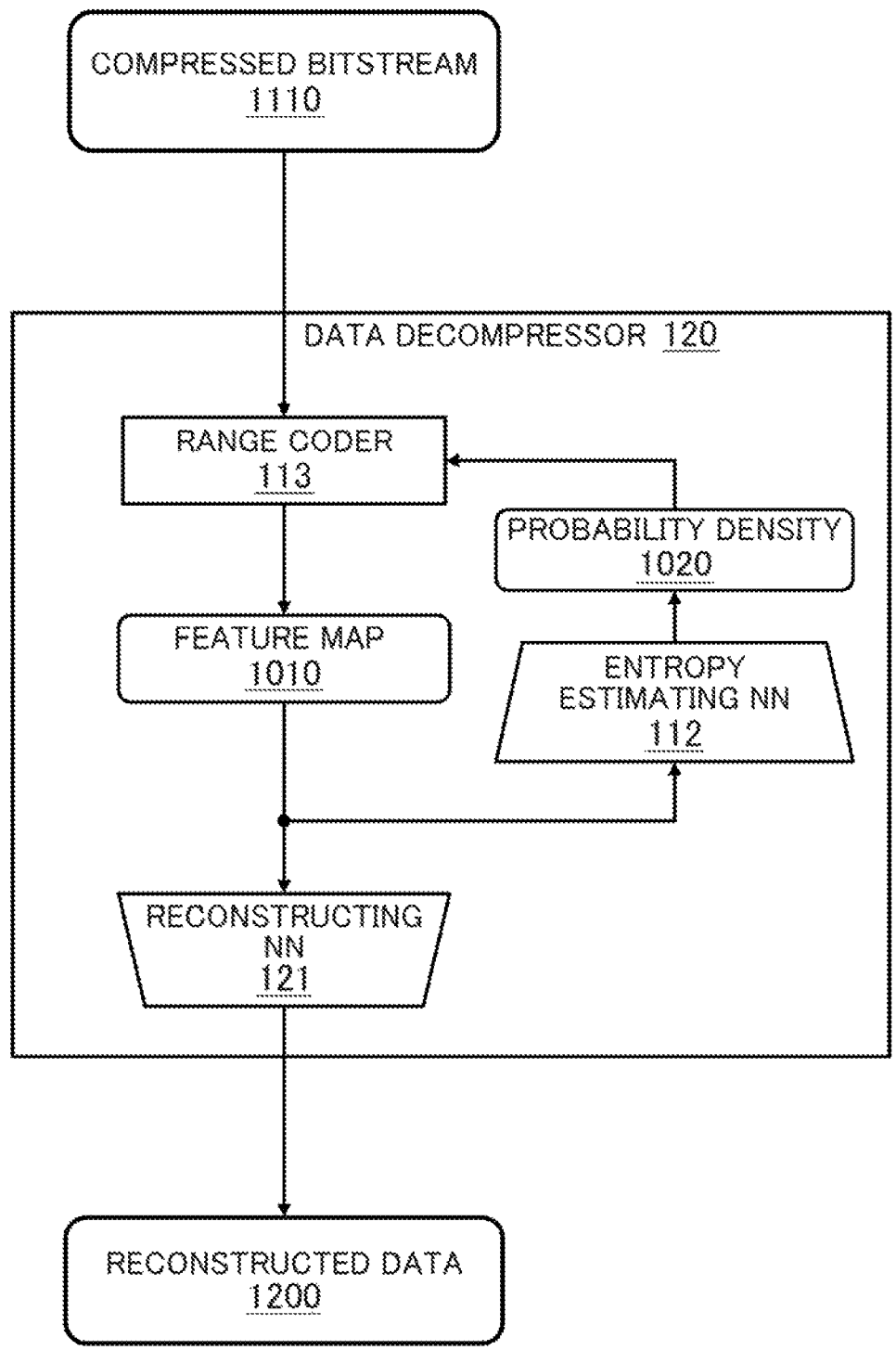
FIG. 9 is a figure depicting an example of a data decompressor according to the first embodiment.

FIG. 9 depicts an example of the internal configuration of the data decompressor 120. The data decompressor 120 includes the entropy estimating neural network 112, the range coder 113, and a reconstructing neural network 121.

As a decompression initialization process, the data decompressor 120 initializes all the elements of the feature map 1010 with initial values. The entropy estimating neural network 112 processes the initialized feature map 1010, and generates the probability density 1020. The range coder 113 reads in the compressed bitstream 1110, and the probability density 1020, and performs reconstruction of the feature map 1010. Depending on the implementation of the range coder 113, a single instance of this procedure reconstructs a part of the feature map 1010 to be reconstructed, and so the data decompressor 120 repeats reconstruction of the feature map 1010, and regeneration of the probability density 1020 until all the elements are reconstructed.

After all the elements of the feature map 1010 are reconstructed, the reconstructing neural network 121 reads in the feature map 1010, and generates and outputs the reconstructed data 1200.

Figure 10:
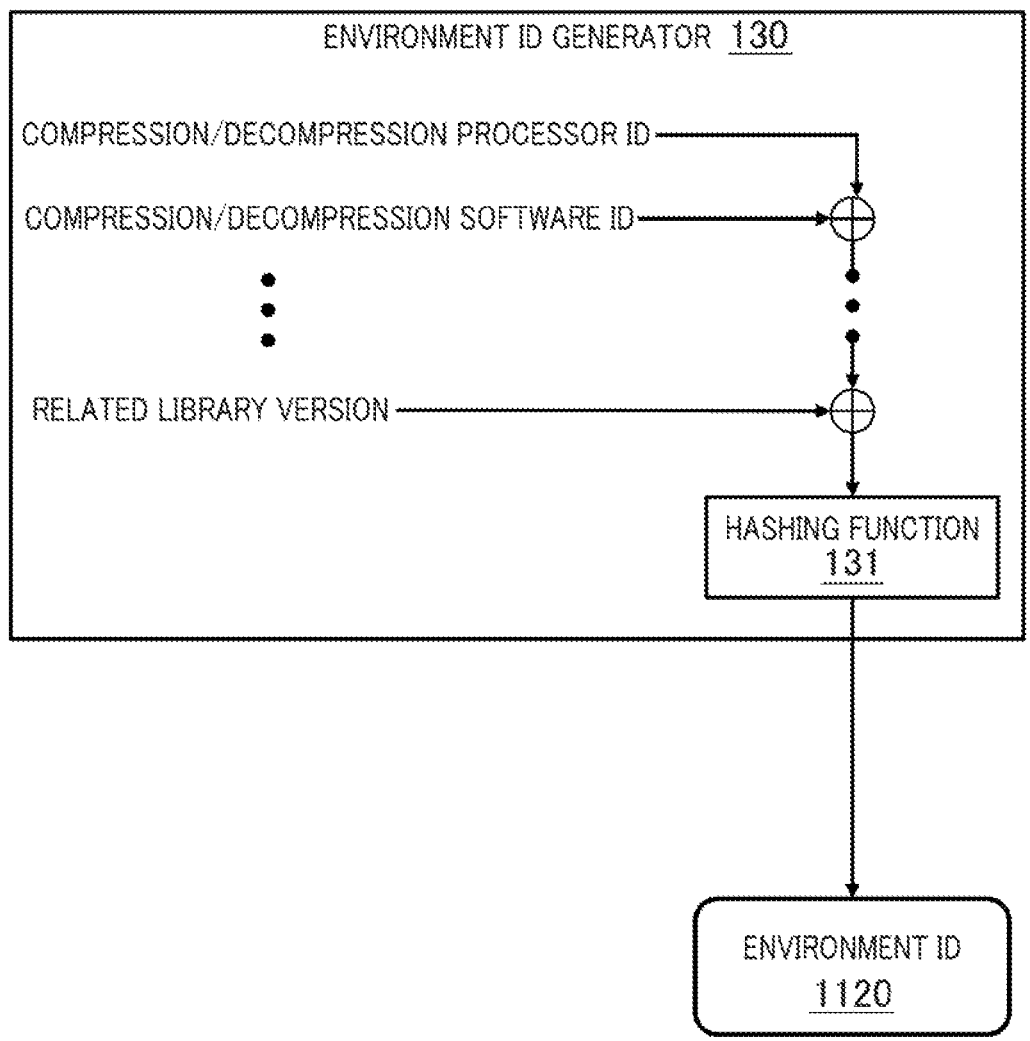
FIG. 10 is a figure depicting an example of an environment ID generator according to the first embodiment.

FIG. 10 depicts an example of the environment ID generator 130. The environment ID generator 130 concatenates an ID of a processor of the computing system 2000 that performs compression or decompression, an ID of software that performs compression or decompression, an ID of a related library, or the like. The concatenation may be performed by simple concatenation of character strings, or addition of IDs by treating the IDs like numerical values.

The environment ID generator 130 inputs the concatenated ID to a hashing function 131, and generates an environment ID 1120 with a fixed length. The hashing function 131 used may be a cryptographic hashing function such as md5 (Message Digest Algorithm 5) or SHA (Secure Hash Algorithm). In addition, the hashing function 131 may generate the environment ID 1120 by concatenating results of splitting the input information into fields, and performing hash computation on the individual fields. In addition, in a case that the input information is already sufficiently short, and there are no practical problems even if the input information is used as is, the environment ID generator 130 may output a portion of or the entire input information as is.

As original data of the generation of the environment ID 1120, in addition to the information above, the type of an OS (Operation System), the version number of the OS, information that can identify a machine learning model, and the like may be included also. In a case that it is possible to keep the consistency of specifications related to an execution environment within a use range of the information mentioned before or in other similar cases, an environment ID of the execution environment may be excluded. For example, in a case that all the computing systems 2000 use the same processor, an ID of the processor does not have to be included in the environment ID 1120.

Figure 11:
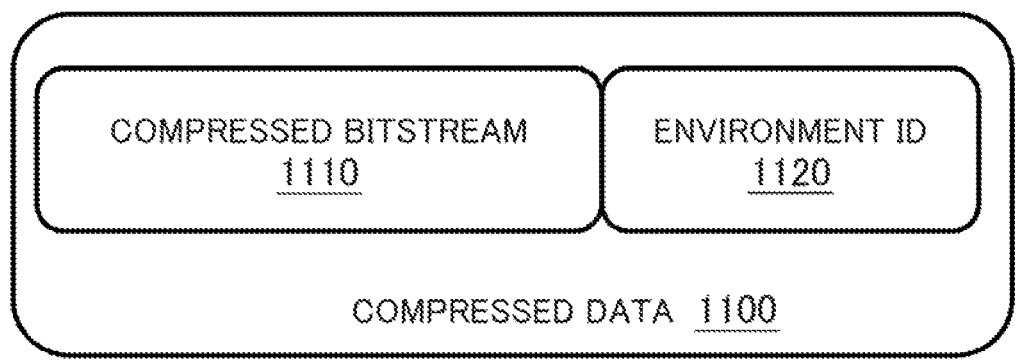
FIG. 11 is a figure depicting an example of the configuration of compressed data according to the first embodiment.

FIG. 11 depicts an example of the configuration of the compressed data 1100. The compressed data 1100 includes at least the compressed bitstream 1110, and the environment ID 1120.

Figure 12:
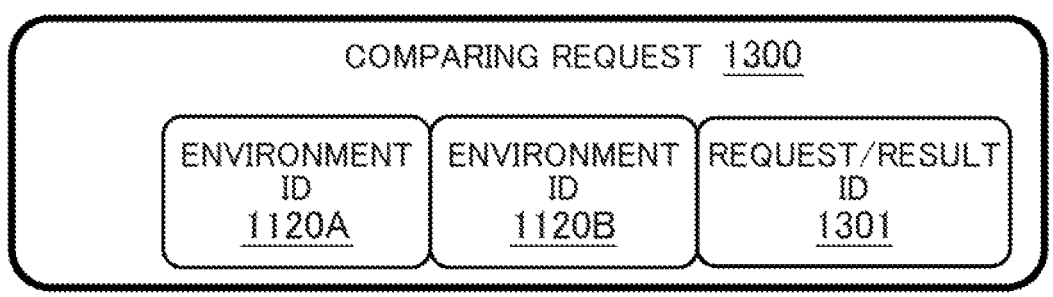
FIG. 12 is a figure depicting an example of the configuration of an environment ID comparing request according to the first embodiment.

FIG. 12 depicts an example of the configuration of the environment ID comparing request 1300. The environment ID comparing request 1300 includes at least the first environment ID 1120A corresponding to a compression environment, the second environment ID 1120B corresponding to a decompression environment, and a request/result ID 1301.

FIG. 13 depicts an example of the configuration of the environment ID comparing result 1310. In a case that the comparing result indicates that "there is interoperability," the environment ID comparing result 1310 includes at least the request/result ID 1301, and the comparing result 1302. In addition, in a case that the comparing result indicates that "there is not interoperability," the environment ID comparing result 1310 includes the access information list 1303 used for accessing the computing system 2000 that is capable of a decompression process, in addition to the request/result ID 1301, and the comparing result 1302.

FIG. 14 depicts an example of the configuration of the decompressing request 1400. The decompressing request 1400 includes at least the request/result ID 1301, and includes either the decompression-target compressed bitstream 1110 or the compressed data access information 1401. The compressed data access information 1401 is positional information necessary for accessing the decompression-target compressed bitstream 1110.

Figure 15:
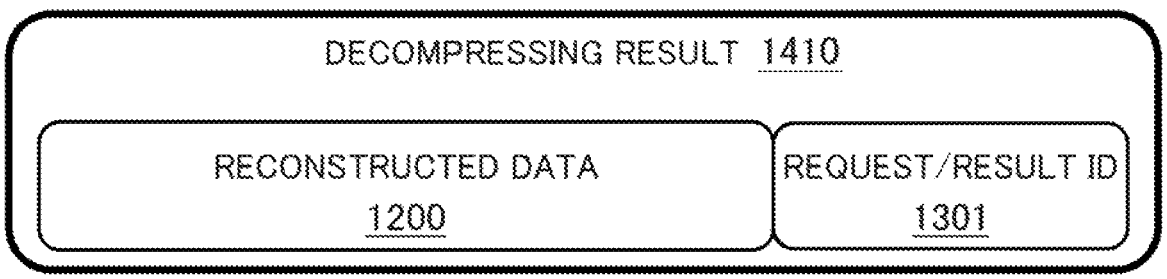
FIG. 15 is a figure depicting an example of the configuration of a decompressing result according to the first embodiment.

FIG. 15 depicts an example of the configuration of the decompressing result 1410. The decompressing result 1410 includes at least the reconstructed data 1200, and the request/result ID 1301.

Figure 16:
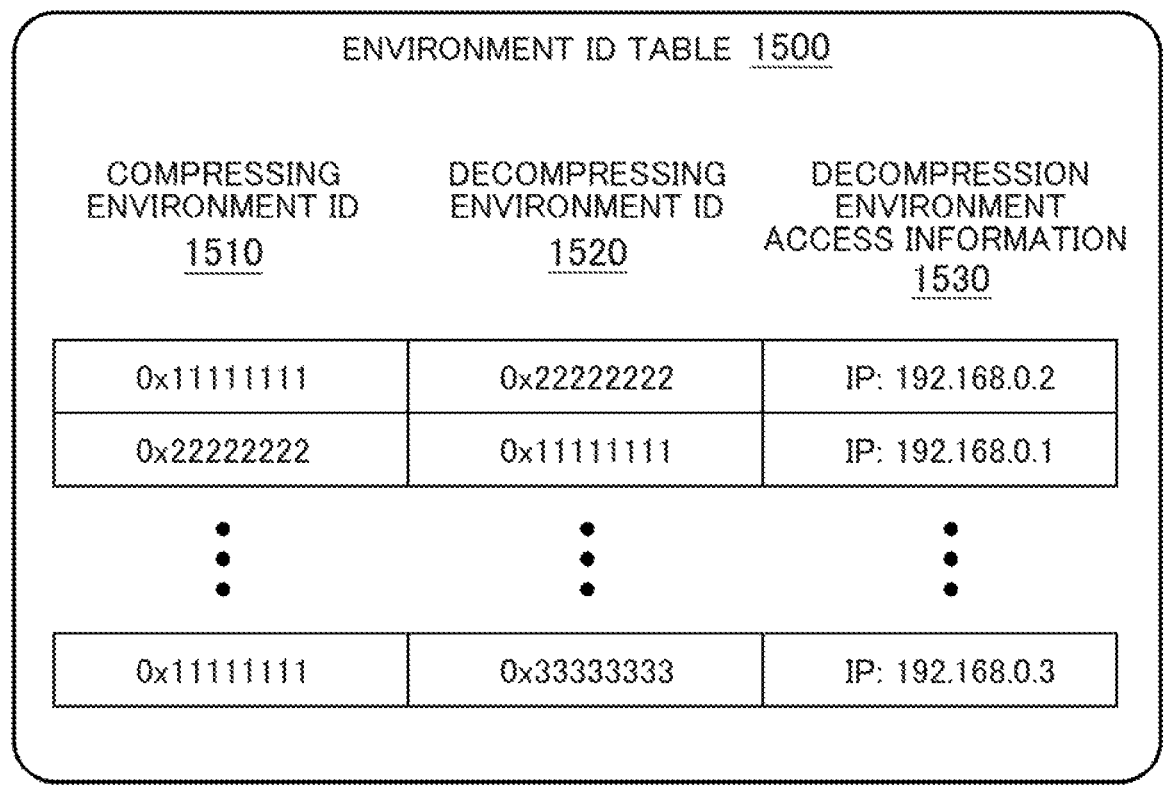
FIG. 16 is a figure depicting an example of the configuration of an environment ID table according to the first embodiment.

FIG. 16 depicts an example of the configuration of the environment ID table 1500. The environment ID table 1500 is a table including a tuple of environment IDs (the compressing environment ID 1510, and the decompressing environment ID 1520) of interoperable execution environments, and the decompression environment access information 1530. In the environment ID table 1500, it is possible to perform a search, and extract an item matching conditions about the compressing environment ID 1510, and the decompressing environment ID 1520 by specifying those conditions. The decompression environment access information 1530 is information for accessing an execution environment (the data processing system 100C, and the computing system 2000D) that is capable of decompression. The decompression environment access information 1530 includes an IP (Internet Protocol) address, a port number, and the like.

Figure 17:
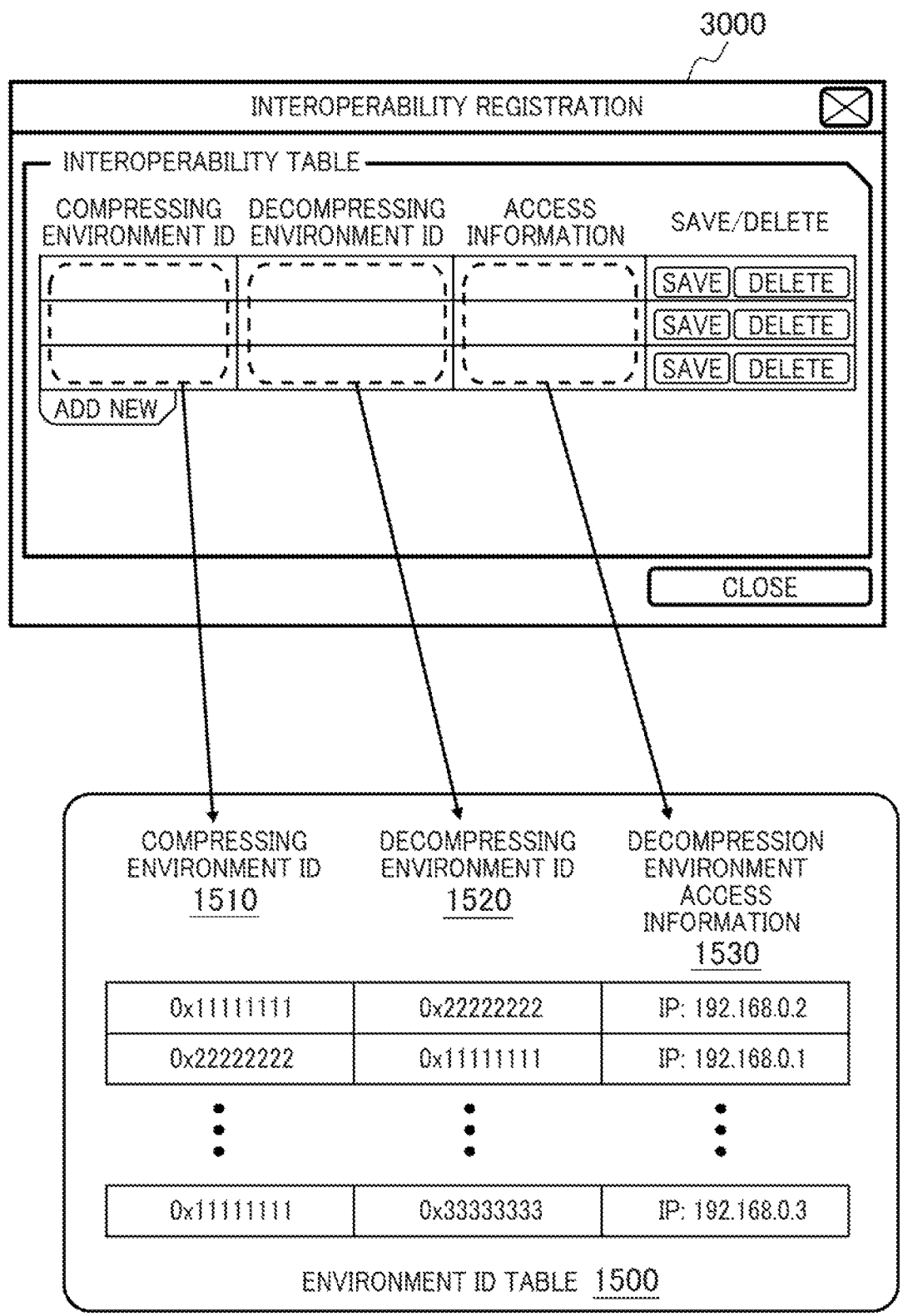
FIG. 17 is a figure depicting an example of a setting screen according to the first embodiment.

FIG. 17 depicts an example (screen 3000) of a setting screen of the environment ID table 1500 owned by the interoperability manager 200. The screen 3000 like the one depicted here allows a user to add, change and delete the compressing environment ID 1510, the decompressing environment ID 1520, and the decompression environment access information 1530.

Note that while a setting interface is illustrated by a GUI (Graphical User Interface) representation in the present example, the setting interface may be configured as a CUI (Character-based User Interface) or in another format.

Figure 18:
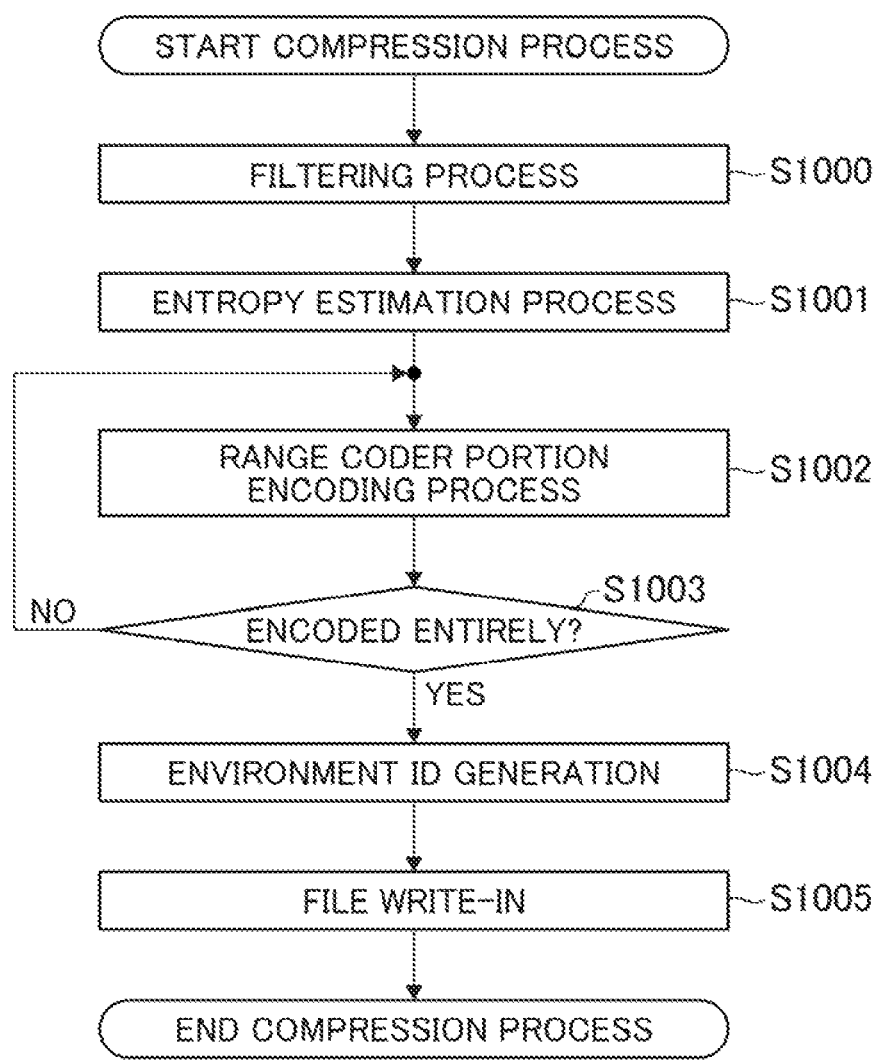
FIG. 18 is a figure depicting an example of a compression process according to the first embodiment.

FIG. 18 depicts an example of a flowchart according to a compression process performed by the data processing system 100A.

(S1000)
The filtering neural network 111 performs filtering. More specifically, the filtering neural network 111 reads in the input data 1000, and generates the feature map 1010.

(S1001)
The entropy estimating neural network 112 performs an entropy estimation process. More specifically, the entropy estimating neural network 112 reads in the feature map 1010, and generates the probability density 1020.

(S1002)
The range coder 113 performs a range coder portion encoding process. More specifically, the range coder 113 reads in the feature map 1010, and the probability density 1020, and converts the feature map 1010 into the compressed bitstream 1110 while using the probability density 1020.

(S1003)
The range coder 113 determines whether or not the entire feature map 1010 has been encoded. In a case that it is determined that the entire feature map 1010 has been converted into the compressed bitstream 1110, the range coder 113 proceeds to the process at S1004, and in a case it is determined that the conversion has not been completed, the range coder 113 proceeds to the process at S1002.

(S1004)
The environment ID generator 130 generates the environment ID 1120.

(S1005)
The environment ID generator 130 writes the compressed bitstream 1110, and the environment ID 1120 in a file or the like, and treats the file or the like as the compressed data 1100.

The data processing system 100A completes the compression process thereby.

Figure 19:
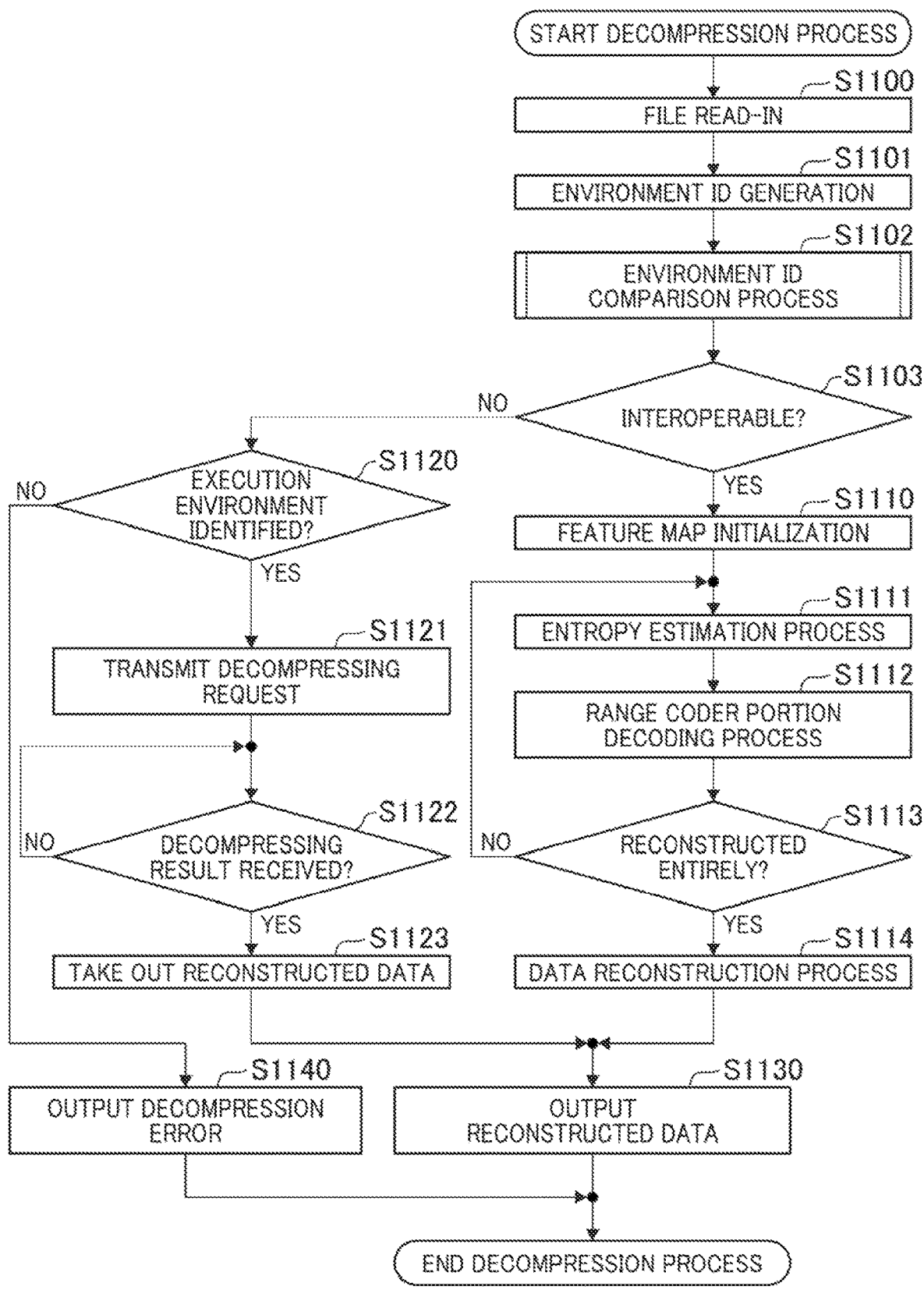
FIG. 19 is a figure depicting an example of a decompression process according to the first embodiment.

FIG. 19 depicts an example of a flowchart according to a decompression process performed by the data processing system 100B.

(S1100)
The data processing system 100B reads in a file or the like. More specifically, the data processing system 100B reads in the compressed data 1100 stored in the file or the like, and takes out the compressed bitstream 1110, and the first environment ID 1120A.

(S1101)
The environment ID generator 130 generates the second environment ID 1120B.

(S1102)
The environment ID comparator 140 performs an environment ID comparison process. In the environment ID comparison process, the environment ID comparator 140 compares the first environment ID 1120A, and the second environment ID 1120B in accordance with a flowchart depicted in FIG. 20, and checks whether or not there is interoperability.

(S1103)
The environment ID comparator 140 determines whether or not there is interoperability. In a case that it is determined that there is interoperability, the environment ID comparator 140 proceeds to the process at S1110, and in a case that it is determined that there is not interoperability, the environment ID comparator 140 proceeds to the process at S1120.

(S1110)
The data decompressor 120 performs initialization by assigning initial values to all the elements of the reconstruction-target feature map 1010.

(S1111)
An entropy estimating neural network 112 performs an entropy estimation process. More specifically, the entropy estimating neural network 112 reads in the feature map 1010, and generates the probability density 1020.

(S1112)
The range coder 113 performs a range coder portion decoding process. More specifically, the range coder 113 reads in a part of the compressed bitstream 1110, and reconstructs the values of some elements of the feature map 1010 in accordance with the probability density 1020.

(S1113)
The range coder 113 determines whether or not all the values of the feature map 1010 have been reconstructed. In a case that it is determine that all the values have been reconstructed, the range coder 113 proceeds to the process at S1114, and in a case that it is determined that the reconstruction has not been completed, the range coder 113 proceeds to the process at S1111.

(S1114)
The reconstructing neural network 121 performs a data reconstruction process. More specifically, the reconstructing neural network 121 reads in the reconstructed feature map 1010, generates the reconstructed data 1200, and proceeds to the process at S1130.

(S1120)
On the basis of the access information list 1303, the data processing system 100B identifies a decompression environment (execution environment) interoperable with the compression environment, and determines whether or not the execution environment could be identified. In a case that it is determined that the execution environment could be identified, the data processing system 100B refers to the decompression environment access information 1530, selects one from the decompression environment access information 1530, and proceeds to the process at 31121. As mentioned above, the decompression environment access information 1530 is information that is generated along with a determination that "there is not interoperability," and is for accessing a decompression environment (the data processing system 100C, and the computing system 2000D) that is interoperable with the compression environment. In a case that it is determined that the execution environment could not be identified, that is, in a case that there are no interoperable data processing systems 100C listed in the access information list 1303, the data processing system 100B proceeds to the process at S1140.

(S1121)

The communicator 150 transmits the decompressing request 1400 to the interoperable data processing system 100C by using the decompression environment access information 1530 selected at S1120.

(S1122)

The communicator 150 determines whether or not the decompressing result 1410 has been received from the data processing system 100C. In a case that it is determined that the decompressing result 1410 has been received, the communicator 150 proceeds to the process at S1123, and in a case that it is determined that the decompressing result 1410 has not been received, the communicator 150 proceeds to the process at S1122. That is, the communicator 150 waits until the decompressing result 1410 is sent back from the data processing system 100C.

(S1123)

The data processing system 100B takes out the reconstructed data 1200 from the decompressing result 1410, and proceeds to the process at S1130.

(S1130)

The data processing system 100B outputs the reconstructed data 1200, and completes the decompression process.

(S1140)

The data processing system 100B outputs an error indicating that decompression is impossible, and completes the decompression process.

Figure 20:
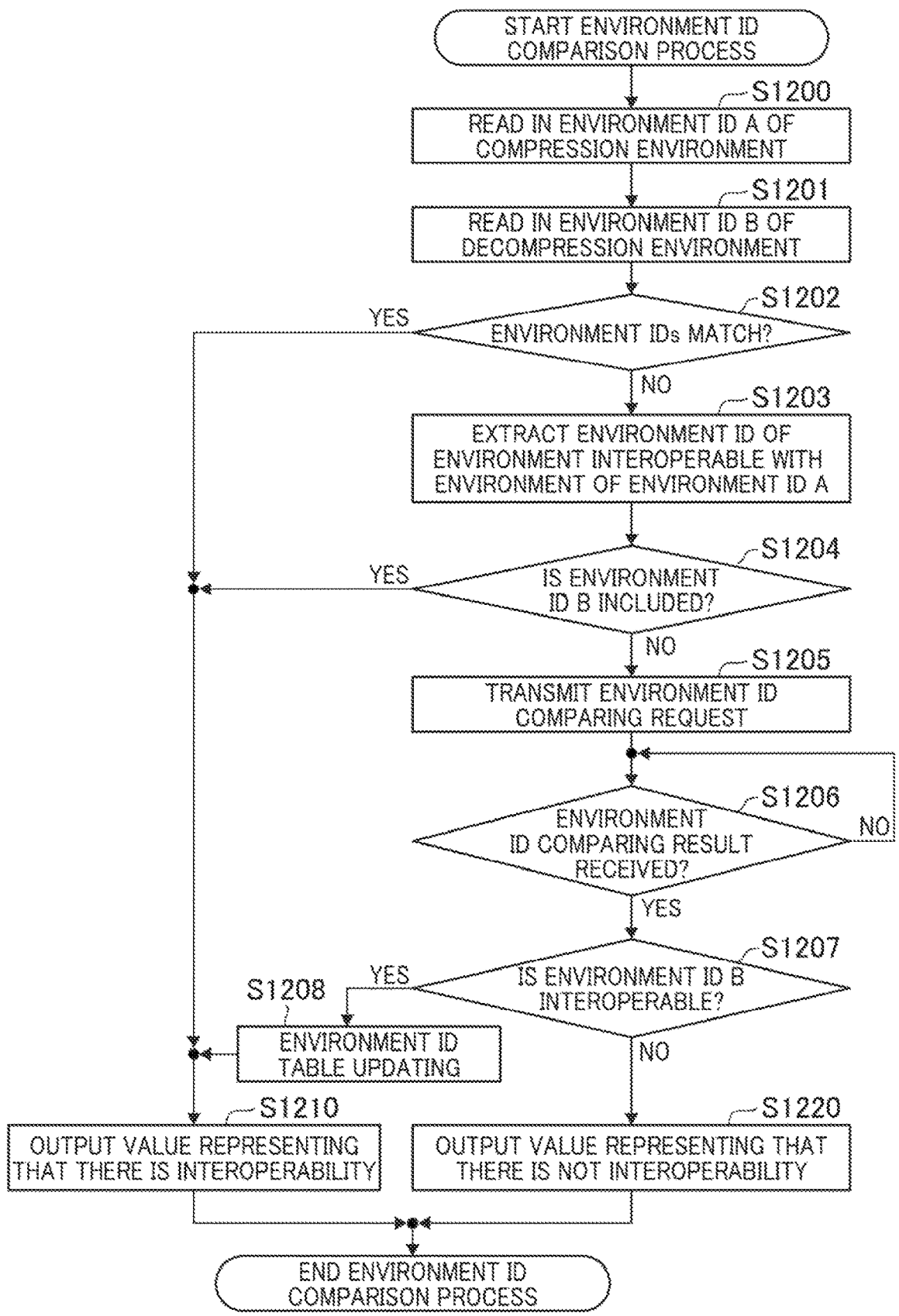
FIG. 20 is a figure depicting an example of an environment ID comparison process according to the first embodiment.

FIG. 20 depicts an example of a flowchart according to an environment ID comparison process performed by the environment ID comparator 140.

(S1200)

The environment ID comparator 140 reads in the first environment ID 1120A (the environment ID A of the compression environment) in the compressed data 1100.

(S1201)

The environment ID comparator 140 reads in the second environment ID 1120B (the environment ID B of the decompression environment) generated by the environment ID generator 130.

(S1202)

The environment ID comparator 140 determines whether or not the first environment ID 1120A, and the second environment ID 1120B match completely. In a case that it is determined that they match, the environment ID comparator 140 proceeds to the process at S1210, and in a case that it is determined that they do not match, the environment ID comparator 140 proceeds to the process at S1203.

(S1203)

The environment ID comparator 140 searches the environment ID table 1500, and extracts registration information (an environment ID of an environment that is interoperable with the environment ID A) matching a combination of the first environment ID 1120A, and the second environment ID 1120B.

(S1204)

The environment ID comparator 140 determines whether or not registration information extracted from the environment ID table 1500 includes information including the second environment ID 1120B (whether or not the environment ID B is included). In a case that it is determined that there is information including the second environment ID 1120B, the environment ID comparator 140 proceeds to the process at S1210, and in a case that it is determined that there is no information including the second environment ID 1120B, the environment ID comparator 140 proceeds to the process at S1205.

(S1205)

The communicator 150 transmits the environment ID comparing request 1300 including the first environment ID 1120A, and the second environment ID 1120B to the interoperability manager 200.

(S1206)

The communicator 150 determines whether or not the environment ID comparing result 1310 from the interoperability manager 200 has been received. In a case that it is determined that the environment ID comparing result 1310 has been received, the communicator 150 proceeds to the process at S1207, and in a case that it is determined that the environment ID comparing result 1310 has not been received, the communicator 150 proceeds to the process at S1206. That is, the communicator 150 repeats the S1206 until the environment ID comparing result 1310 is received.

(S1207)

The environment ID comparator 140 refers to the comparing result 1302 of the environment ID comparing result 1310, and determines whether or not the data processing system 100B corresponding to the second environment ID 1120B is interoperable. In a case that it is determined that there is interoperability, the environment ID comparator 140 proceeds to the process at S1208, and in a case that it is determined that there is not interoperability, the environment ID comparator 140 proceeds to the process at S1220.

(S1208)

The environment ID comparator 140 updates the environment ID table 1500. More specifically, the environment ID comparator 140 registers the combination of the first environment ID 1120A, and the second environment ID 1120B in the environment ID table 1500 of the data processing system 100B, and proceeds to the process at S1210. This process makes it possible for the environment ID comparator 140 to determine the interoperability of the first environment ID 1120A, and the second environment ID 1120B without making an inquiry to the interoperability manager 200.

(S1210)

The environment ID comparator 140 outputs a value representing that "there is interoperability," and completes the environment ID comparison process.

(S1220)

The environment ID comparator 140 outputs a value representing that "there is not interoperability," and the access information list 1303 of the environment ID comparing result 1310, and completes the environment ID comparison process.

Figure 21:
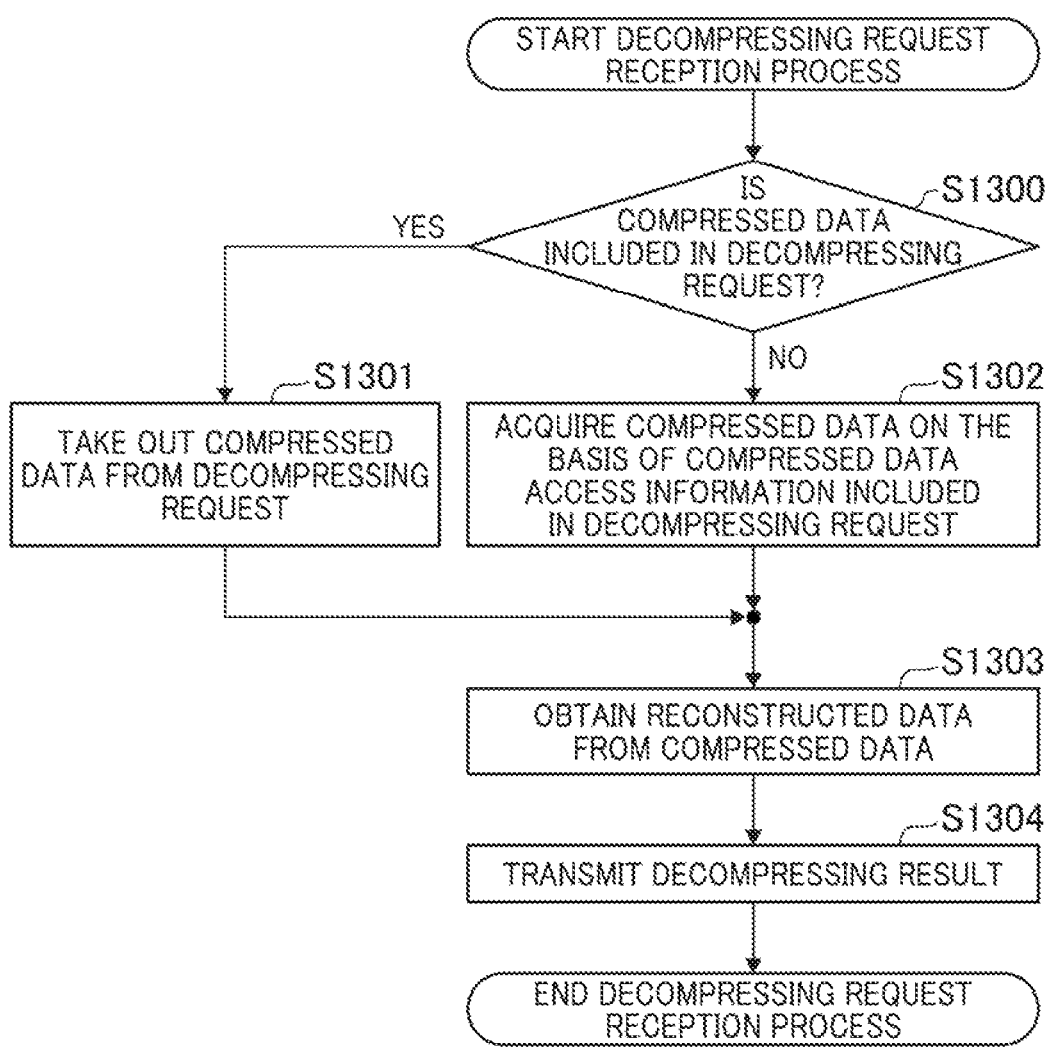
FIG. 21 is a figure depicting an example of a decompressing request reception process according to the first embodiment.

FIG. 21 depicts an example of a flowchart according to a decompressing request reception process executed by the data processing system 100C.

(S1300)

The data processing system 100C receives the decompressing request 1400, and determines whether or not the decompressing request 1400 includes the compressed bitstream 1110 (compressed data). In a case that it is determined that the compressed bitstream 1110 is included, the data processing system 100C proceeds to the process at S1301. On the other hand, in a case that it is determined that the compressed bitstream 1110 is not included, that is, in a case that it is determined that the compressed data access information 1401 for accessing the compressed bitstream 1110 is included, the data processing system 100C proceeds to the process at S1302.

(S1301)

The data processing system 100C takes out the compressed bitstream 1110 from the decompressing request 1400, and proceeds to the process at S1303.

(S1302)

On the basis of the compressed data access information 1401 included in the decompressing request 1400, the data processing system 100C accesses the compressed data 1100, and takes out the compressed bitstream 1110 from the compressed data 1100.

(S1303)

The data processing system 100C inputs the compressed bitstream 1110 to the data decompressor 120, and obtains the reconstructed data 1200.

(S1304)

The data processing system 100C transmits the decompressing result 1410 including the reconstructed data 1200 to the sender of the decompressing request 1400, and completes the decompressing request reception process.

FIG. 22 depicts an example of a flowchart according to a comparing request reception process executed by the interoperability manager 200.

(S1400)

The interoperability manager 200 receives the environment ID comparing request 1300, takes out the first environment ID 1120A corresponding to the compression environment, and the second environment ID 1120B corresponding to the decompression environment that are included in the environment ID comparing request 1300, and transfers them to the central environment ID comparator 210. The central environment ID comparator 210 searches the environment ID table 1500, and extracts registration information matching a combination of the first environment ID 1120A, and the second environment ID 1120B.

(S1401)

The central environment ID comparator 210 determines whether or not there is information that matches the combination of the first environment ID 1120A, and the second environment ID 1120B in the extracted registration information. In a case that it is determined that there is matching information, the central environment ID comparator 210 proceeds to the process at S1410, and in a case that it is determined that there is not matching information, the central environment ID comparator 210 proceeds to the process at S1402.

(S1402)

The central environment ID comparator 210 extracts, from the environment ID table 1500, registration information (decompression environment access information 1530) matching the first environment ID 1120A corresponding to the compression environment.

(S1403)

The interoperability manager 200 stores a value representing that "there is not interoperability" in the comparing result 1302 in the environment ID comparing result 1310, and stores, in the access information list 1303, the decompression environment access information 1530 extracted at S1402. The interoperability manager 200 transmits the environment ID comparing result 1310 to the sender of the environment ID comparing request 1300, and completes the comparing request reception process.

(S1410)

The interoperability manager 200 stores a value representing that "there is interoperability" in the comparing result 1302 in the environment ID comparing result 1310. The interoperability manager 200 transmits the environment ID comparing result 1310 to the sender of the environment ID comparing request 1300, and completes the comparing request reception process.

The present embodiment has been explained thus far, but this is illustration for explaining the present invention, and is not aimed to limit the scope of the present invention only to this embodiment. The present invention can be executed also in other various forms.

(2) Additional Notes

For example, the embodiment mentioned above includes contents like the ones mentioned below.

While the present invention is applied to a data compression/decompression system in a case mentioned in the embodiment mentioned above, the present invention is not limited to this, and can be applied widely to other various types of systems, apparatuses, methods, programs, and the like.

In addition, while the type of the input data 1000 is one-dimensional data, two-dimensional data or the like in a case mentioned in the embodiment mentioned above, the present invention is not limited to this. The type of the input data 1000 may be multi-dimensional data like three-dimensional data. In this case, time-series data includes data in which multi-dimensional data, and time are associated with each other.

In addition, while the data processing system 100A includes the data compressor 110 in a case mentioned in the embodiment mentioned above, the present invention is not limited to this. The data processing system 100A may include the data decompressor 120 or the like.

In addition, while each of the data processing system 100B, and the data processing system 100C includes the data decompressor 120 in a case mentioned in the embodiment mentioned above, the present invention is not limited to this. Each of the data processing system 100B, and the data processing system 100C may include the data compressor 110.

In addition, while the interoperability manager 200 includes the central environment ID comparator 210 in a case mentioned in the embodiment mentioned above, the present invention is not limited to this. The interoperability manager 200 may include the data compressor 110, and/or the data decompressor 120.

In addition, while the data processing system 100B makes an inquiry to the interoperability manager 200 about a data processing system 100 that is capable of decompression of compressed data in a case mentioned in the embodiment mentioned above, the present invention is not limited to this. The data processing system 100B may make an inquiry to another data processing system 100 as to whether the data processing system 100 is capable of decompression of compressed data. In this case, the data processing system 100B may include the environment ID of a compression environment in the inquiry, may include the compressed data in the inquiry or may include positional information of the compressed data in the inquiry.

In addition, in the embodiment mentioned above, the configuration of each table is an example, one table may be divided into two or more tables, or some or all of two or more tables may be one table.

In addition, in the embodiment mentioned above, screens that are depicted and explained are examples, and may have any designs as long as they can receive the same information.

In addition, in the embodiment mentioned above, information output is not limited to display on a display. Information output may be sound output by a speaker, may be output to a file, may be printing on a paper medium or the like by a printing apparatus, may be projection onto a screen or the like by a projector or may be another mode.

In addition, information such as a program, a table, or a file that realizes each functionality in the explanation described above can be placed in a storage device such as a memory, a hard disk or an SSD, or in a recording medium such as an IC card, an SD card or a DVD.

The embodiment mentioned above has the following characteristic configurations, for example.

A data compression/decompression system (e.g. the data compression/decompression system 1) is a data compression/decompression system that controls compression, and/or decompression of data performed by using a machine learning model (e.g. a neural network) at each of a plurality of computers (e.g. the data processing systems 100, and the computing systems 2000), a first computer (e.g. the data processing system 100A, the computing system 2000A, and the computing system 2000B) that performs compression of data in a first execution environment: generates first identification information (e.g. the first environment ID 1120A) that can identify the first execution environment (e.g. see S1004); and stores the first identification information on a storage device (e.g. the storage device) in association with compressed data (e.g. the compressed bitstream 1110) of the data (e.g. see S1005), a second computer (e.g. the data processing system 100B, and the computing system 2000C) that performs decompression of the compressed data in a second execution environment: generates second identification information (e.g. the second environment ID 1120B) that can identify the second execution environment (e.g. see S1101); and determines whether or not the first identification information, and the second identification information match (e.g. see S1202), and in a case that it is determined that the first identification information, and the second identification information do not match, the second computer requests a third computer (e.g. the data processing system 100C, and the computing system 2000D) that is capable of decompression of the compressed data to decompress the compressed data (e.g. see S1121), the third computer decompresses the compressed data (e.g. see S1303), and transmits decompressed data to the second computer (e.g. see S1304), and the second computer completes the decompression of the compressed data by receiving the decompressed data from the third computer (e.g. see S1123, and S1130).

According to the configuration described above, for example, in a case that the compressed data is decompressed in the second execution environment which is different from an execution environment at the time of compression, it becomes possible for the second computer to determine whether or not the decompression will be completed normally. In addition, for example, according to the configuration described above, in a case that the decompression will not be able to be completed normally, the second computer can complete the decompression by requesting the third execution environment which serves as a proxy to perform the decompression.

As the first identification information, the first computer acquires information (e.g. an ID of a processor, a product name of a processor, and/or a model name of a processor) that can identify a processor to be used for compression of data, and as the second identification information, the second computer acquires information (e.g. an ID of a processor, a product name of a processor, and/or a model name of a processor) that can identify a processor to be used for decompression of compressed data.

According to the configuration described above, for example, even if a processor at the time of compression, and a processor at the time of a decompression are different from each other, the compressed data can be decompressed appropriately.

As the first identification information, the first computer acquires information (e.g. an identification number of a library, a name of a library, and/or a version number of a library) that can identify a machine learning library (a machine learning library to be used in a process when a machine learning model to be used for compression of data is driven) to be used for compression of data, and as the second identification information, the second computer acquires information (e.g. an identification number of a library, a name of a library, and/or a version number of a library) that can identify a machine learning library (a machine learning library to be used in a process when a machine learning model to be used for decompression of compressed data is driven) to be used for decompression of compressed data.

According to the configuration described above, for example, even if a machine learning library at the time of compression, and a machine learning library at the time of a decompression are different from each other, the compressed data can be decompressed appropriately.

Data to be compressed by the first computer is two-dimensional data (e.g. an image) or time-series data (e.g. a moving image).

According to the configuration described above, the compressed data of the two-dimensional data, or the compressed data of the time-series data can be decompressed appropriately.

By using interoperability information (e.g. the environment ID table 1500) in which identification information that can identify interoperable execution environments is associated with each other, the second computer determines whether or not there is interoperability between the first execution environment, and the second execution environment (e.g. see S1203, and S1204), and in a case that it is determined that the first execution environment, and the second execution environment do not match, and it is determined that there is not interoperability between the first execution environment, and the second execution environment, the second computer requests the third computer to decompress the compressed data.

According to the configuration described above, it becomes possible to determine whether or not there is interoperability between the first execution environment at the time of compression, and the second execution environment at the time of decompression. According to the configuration described above, in a case that the execution environments are not identical, and there is not interoperability between the execution environments, it is possible to complete the decompression by requesting the third computer which serves as a proxy to perform decompression.

The second computer makes an inquiry including the first identification information, and the second identification information to a managing device (e.g. the interoperability manager 200), the managing device: determines whether or not there is interoperability between the first execution environment, and the second execution environment by using interoperability information (e.g. the environment ID table 1500) in which identification information that can identify interoperable execution environments is associated with each other (e.g. see S1400, and S1401); and transmits an interoperability determination result to the second computer (e.g. see S1403, and S1404), and in a case that it is determined that the first execution environment, and the second execution environment do not match, and it is determined, on a basis of the interoperability determination result, that there is not interoperability between the first execution environment, and the second execution environment, the second computer requests the third computer to decompress the compressed data.

According to the configuration described above, in a case that the first execution environment at the time of compression, and the second execution environment at the time of decompression are different from each other, it becomes possible to determine, at the managing device, whether or not there is interoperability between the first execution environment, and the second execution environment. According to the configuration described above, because it is not necessary to provide interoperability information for each computer to perform a decompression, the maintenance of the interoperability information becomes easier.

In the interoperability information, identification information that can identify an execution environment in which compression of data is performed, identification information that can identify an execution environment in which decompression of compressed data of the data is performed, and access information necessary for accessing a computer that is capable of decompression of the compressed data are associated with each other (e.g. see FIG. 16), in a case that it is determined that there is not interoperability between the first execution environment, and the second execution environment, the managing device acquires, from the interoperability information, access information about access to the third computer that is capable of decompression of compressed data obtained by compression performed in the first execution environment, and includes the access information in the interoperability determination result (e.g. see S1402, and S1403), and on a basis of the access information, the second computer requests the third computer to decompress the compressed data.

According to the configuration described above, in a case that there is not interoperability between the first execution environment at the time of compression, and the second execution environment at the time of decompression, it is possible to acquire, from the interoperability information, access information for accessing a computer of an execution environment that is interoperable with the first execution environment. According to the configuration described above, in a case that the execution environments are not identical, and there is not interoperability between the execution environments, it becomes possible to request the third computer which is capable of decompression of the compressed data to perform decompression, on the basis of the access information.

In addition, the configurations mentioned above may be changed, rearranged, combined, omitted, and so on as appropriate within the scope of the gist of the present invention.

It should be understood that items included in a list with a format that "at least one of A, B, and C" can mean (A), (B), (C), (A, and B), (A, and C), (B, and C) or (A, B, and C). Similarly, items listed in a format that "at least one of A, B or C" can mean that (A), (B), (C), (A, and B), (A, and C), (B, and C) or (A, B, and C).

What is claimed is:

1. A data compression/decompression system that controls compression, and/or decompression of data performed by using a machine learning model at each of a plurality of computers, wherein a first computer that performs compression of data in a first execution environment:
generates first identification information that can identify the first execution environment; and
stores the first identification information on a storage device in association with compressed data of the data,
a second computer that performs decompression of the compressed data in a second execution environment:
generates second identification information that can identify the second execution environment; and
determines whether or not the first identification information, and the second identification information match,
in a case that it is determined that the first identification information, and the second identification information do not match,
the second computer requests a third computer that is capable of decompression of the compressed data to decompress the compressed data,
the third computer decompresses the compressed data, and transmits decompressed data to the second computer, and
the second computer completes the decompression of the compressed data by receiving the decompressed data from the third computer, and
in a case that it is determined that the first execution environment and the second execution environment do not match, and it is determined that, based on an interoperability determination result transmitted to the second computer, there is not interoperability between the first execution environment and the second execution environment, the second computer requests the third computer to decompress the compressed data.

2. The data compression/decompression system according to claim 1, wherein
as the first identification information, the first computer acquires information that can identify a processor to be used for compression of data, and
as the second identification information, the second computer acquires information that can identify a processor to be used for decompression of compressed data.

3. The data compression/decompression system according to claim 1, wherein
as the first identification information, the first computer acquires information that can identify a machine learning library to be used for compression of data, and
as the second identification information, the second computer acquires information that can identify a machine learning library to be used for decompression of compressed data.

4. The data compression/decompression system according to claim 1, wherein data to be compressed by the first computer is two-dimensional data or time-series data.

5. The data compression/decompression system according to claim 1, wherein
by using interoperability information in which identification information that can identify interoperable execution environments is associated with each other, the second computer determines whether or not there is interoperability between the first execution environment, and the second execution environment.

6. The data compression/decompression system according to claim 1, wherein
the second computer makes an inquiry including the first identification information, and the second identification information to a managing device, the managing device:
   determines whether or not there is interoperability between the first execution environment, and the second execution environment by using interoperability information in which identification information that can identify interoperable execution environments is associated with each other; and
   transmits the interoperability determination result to the second computer.

7. The data compression/decompression system according to claim 6, wherein
   in the interoperability information, identification information that can identify an execution environment in which compression of data is performed, identification information that can identify an execution environment in which decompression of compressed data of the data is performed, and access information necessary for accessing a computer that is capable of decompression of the compressed data are associated with each other,
   in a case that it is determined that there is not interoperability between the first execution environment, and the second execution environment, the managing device acquires, from the interoperability information, access information about access to the third computer that is capable of decompression of compressed data obtained by compression performed in the first execution environment, and includes the access information in the interoperability determination result, and
   on a basis of the access information, the second computer requests the third computer to decompress the compressed data.

8. A data compression/decompression method of controlling compression, and/or decompression of data performed by using a machine learning model at each of a plurality of computers, the data compression/decompression method comprising:

generating, by a first computer that performs compression that performs compression of data in a first execution environment, first identification information that can identify the first execution environment;

storing, by the first computer, the first identification information on a storage device in association with compressed data of the data;

generating, by a second computer that performs decompression of the compressed data in a second execution environment, second identification information that can identify the second execution environment;

determining, by the second computer, whether or not the first identification information, and the second identification information match; and in a case that it is determined that the first identification information, and the second identification information do not match,
   requesting, by the second computer, a third computer that is capable of decompression of the compressed data to decompress the compressed data,
   decompressing, by the third computer, the compressed data, and transmitting, by the third computer, decompressed data to the second computer, and
   completing, by the second computer, the decompression of the compressed data by receiving the decompressed data from the third computer, wherein, in a case that it is determined that the first execution environment and the second execution environment do not match, and it is determined that, based on an interoperability determination result transmitted to the second computer, there is not interoperability between the first execution environment and the second execution environment, the second computer requests the third computer to decompress the compressed data.

* * * * *